(12) United States Patent
Kito et al.

(10) Patent No.: US 9,539,800 B2
(45) Date of Patent: Jan. 10, 2017

(54) SUBSTRATE BONDING APPARATUS, SUBSTRATE HOLDING APPARATUS, SUBSTRATE BONDING METHOD, SUBSTRATE HOLDING METHOD, MULTILAYERED SEMICONDUCTOR DEVICE, AND MULTILAYERED SUBSTRATE

(71) Applicant: NIKON CORPORATION, Tokyo (JP)

(72) Inventors: Yoshiaki Kito, Kamakura (JP); Hiroshi Shirasu, Yokohama (JP); Masahiro Yoshihashi, Abiko (JP); Daisuke Yuki, Yokohama (JP); Kazuhiro Suzuki, Tokyo (JP); Isao Sugaya, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 236 days.

(21) Appl. No.: 14/062,988

(22) Filed: Oct. 25, 2013

(65) Prior Publication Data
US 2014/0072774 A1    Mar. 13, 2014

Related U.S. Application Data

(63) Continuation of application No. PCT/JP2012/002830, filed on Apr. 25, 2012.

(30) Foreign Application Priority Data

Apr. 26, 2011    (JP) .................................. 2011-097873

(51) Int. Cl.
*H01L 21/67*    (2006.01)
*H01L 21/68*    (2006.01)
(Continued)

(52) U.S. Cl.
CPC ....... *B32B 38/1833* (2013.01); *B32B 37/0046* (2013.01); *B32B 38/1841* (2013.01);
(Continued)

(58) Field of Classification Search
None
See application file for complete search history.

(56) References Cited

U.S. PATENT DOCUMENTS

| | | | | |
|---|---|---|---|---|
| 5,129,827 A | * | 7/1992 | Hoshi | H01L 21/67092 148/DIG. 12 |
| 2003/0081193 A1 | * | 5/2003 | White | B82Y 10/00 355/72 |
| 2009/0314420 A1 | * | 12/2009 | Tahira | B32B 37/003 156/196 |

FOREIGN PATENT DOCUMENTS

| | | | | |
|---|---|---|---|---|
| BE | 1010361 A6 | * | 7/1998 | ............... B30B 1/34 |
| JP | 7-66093 | | 3/1995 | |

(Continued)

OTHER PUBLICATIONS

International Search Report from the Japanese Patent Office in International Application No. PCT/JP2012/002830, mailed May 22, 2012, 8 pages.

(Continued)

*Primary Examiner* — Barbara J Musser
(74) *Attorney, Agent, or Firm* — Finnegan, Henderson, Farabow, Garrett & Dunner, LLP

(57) ABSTRACT

Substrates are aligned and then bonded to each other. A substrate bonding apparatus includes a deformer that deforms at least a first one of two substrates that are to be bonded to each other in order to correct misalignment between the two substrates, a holder that holds the deformed first substrate in the deformed state achieved by the deformer, a transporter that transports the holder from a position at which the deformed first substrate is held by the holder while the first substrate remains deformed, and a bonder that bonds the first substrate that has been transported by the transporter to the second substrate. In the above-described substrate bonding apparatus, while the first (Continued)

substrate is not held by the holder, the deformer may deform the holder from a first state to a second state that is more deformed than the first state, and while the first substrate is held by the holder, the deformer may reduce the amount of the deformation of the holder to less than the amount of the deformation of the second state to deform the first substrate.

27 Claims, 30 Drawing Sheets

(51) Int. Cl.
| | |
|---|---|
| B32B 38/18 | (2006.01) |
| H01L 21/683 | (2006.01) |
| H01L 21/687 | (2006.01) |
| H01L 23/12 | (2006.01) |
| B32B 37/00 | (2006.01) |
| H01L 21/20 | (2006.01) |
| B32B 37/08 | (2006.01) |
| B32B 38/00 | (2006.01) |

(52) U.S. Cl.
CPC .... *H01L 21/2007* (2013.01); *H01L 21/67092* (2013.01); *H01L 21/67288* (2013.01); *H01L 21/681* (2013.01); *H01L 21/6838* (2013.01); *H01L 21/68735* (2013.01); *H01L 23/12* (2013.01); *B32B 37/08* (2013.01); *B32B 38/1875* (2013.01); *B32B 2307/208* (2013.01); *B32B 2309/60* (2013.01); *B32B 2457/14* (2013.01); *H01L 2924/0002* (2013.01); *Y10T 156/1002* (2015.01); *Y10T 428/24628* (2015.01)

(56) References Cited

FOREIGN PATENT DOCUMENTS

| JP | 7-94675 | 4/1995 |
|----|---------|--------|
| JP | 2005-251972 | 9/2005 |
| JP | 2011-49450 | 3/2011 |
| JP | 2011-71331 | 4/2011 |
| JP | 2011-071331 | 4/2011 |

OTHER PUBLICATIONS

International Preliminary Report of Patentability from the Japanese Patent Office in International Application No. PCT/JP20121002830, mailed Nov. 7, 2013, 2 pages.

Written Opinion of the International Searching Authority from the Japanese Patent Office in International Application No. PCT/JP2012/002630, mailed May 22, 2012, 6 pages.

Supplementary European Search Report issued by the European Patent Office in International Application No. 12776360.5-1706/2704182.

Office Action issued from the Taiwan Intellectual Property Office in Taiwan application No. 101114657, on Mar. 1, 2016 (15 pages).

* cited by examiner

SUBSTRATE BONDING APPARATUS, SUBSTRATE HOLDING APPARATUS, SUBSTRATE BONDING METHOD, SUBSTRATE HOLDING METHOD, MULTILAYERED SEMICONDUCTOR DEVICE, AND MULTILAYERED SUBSTRATE

BACKGROUND

1. Technical Field

The present invention relates to a substrate bonding apparatus, a substrate holding apparatus, a substrate bonding method, a substrate holding method, a multilayered semiconductor device and a multilayered substrate.

2. Related Art

A known multilayered semiconductor device is provided by stacking and bonding a plurality of substrates onto each other (see Japanese Patent Application Publication No. 2005-251972). To bond a plurality of substrates together, the substrates are aligned to each other with high accuracy on the order of the line width of semiconductor devices.

Referring to semiconductor device manufacturing process, parameters such as the magnification ratios of patterns transferred from masks and substrate flatness may be different globally or locally on substrates. Therefore, substrates to be bonded together cannot be aligned to each other simply by moving them relative to each other.

SUMMARY

Therefore, it is an object of an aspect of the innovations herein to provide a substrate bonding apparatus, a substrate holding apparatus, a substrate bonding method, a substrate holding method, a multilayered semiconductor device and a multilayered substrate, which are capable of overcoming the above drawbacks accompanying the related art. The above and other objects can be achieved by combinations described in the claims. A first aspect of the innovations may include a substrate holding apparatus including a holder that holds a substrate to be bonded to another substrate, and a deformer that deforms the substrate held by the holder in a direction intersecting the surface of the held substrate in order to correct misalignment between the held substrate and the other substrate.

A second aspect of the innovations disclosed herein may include a substrate bonding apparatus for bonding a substrate to another substrate. The substrate bonding apparatus includes the above-described substrate holding apparatus.

A third aspect of the innovations disclosed herein may include a substrate holding method comprising deforming a substrate held by a holder in a direction intersecting the surface of the held surface in order to correct misalignment between the held substrate and another substrate to be bonded to the held substrate.

A fourth aspect of the innovations disclosed herein may include a substrate bonding method using the above-described substrate holding method to bond the held substrate to the other substrate.

A fifth aspect of the innovations disclosed herein may include a multilayered semiconductor device manufactured using the above-described substrate bonding method.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
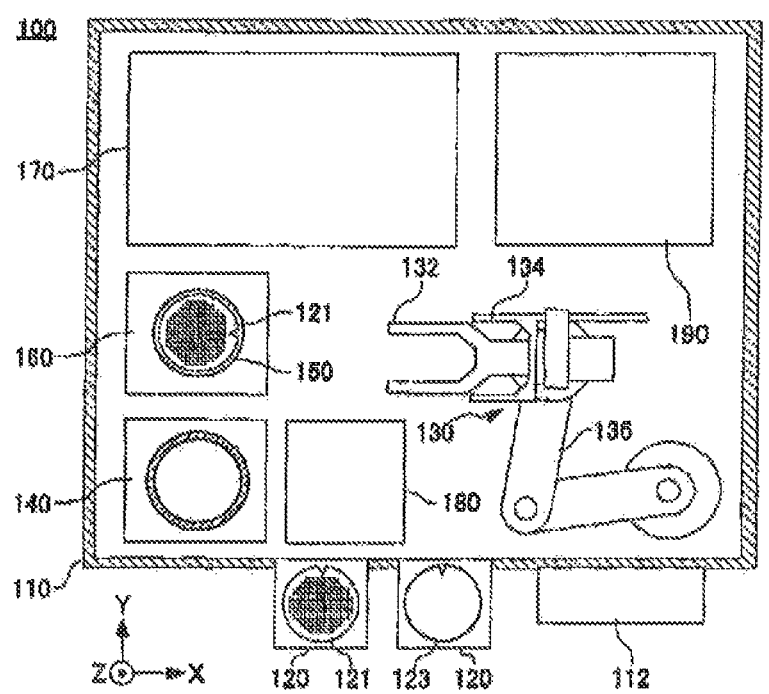
FIG. 1 is a schematic plan view of a multilayered substrate manufacturing apparatus 100.

FIG. 1 is a schematic plan view of a multilayered substrate manufacturing apparatus 100. The multilayered substrate manufacturing apparatus 100 manufactures a multilayered substrate 123 by stacking a pair of substrates 121 onto each other.

The multilayered substrate manufacturing apparatus 100 includes a housing 110, a loader 130 housed within the housing 110, a holder stocker 140, a pre-aligner 160, an aligner 170, a bender 180 and a pressing apparatus 190. On the external surface of the housing 110, a controller 112 and a plurality of front opening unified pods (FOUPs) 120 are arranged.

The multilayered substrate manufacturing apparatus 100 further includes the controller 112. The controller 112 controls the operations of the entire multilayered substrate manufacturing apparatus 100 according to the procedures that have been implemented in advance or are read from an external source. The FOUPs 120 each house a plurality of substrates 121 therein and can be attached onto or detached from the housing 110 independently.

Using the FOUPs 120, a plurality of substrates 121 can be collectively loaded onto the multilayered substrate manufacturing apparatus 100. In addition, the FOUPs 120 can be used so that a plurality of multilayered substrates 123, each of which is fabricated by stacking the substrates 121, can be collected and collectively transported out.

Here, the substrates 121 each can be a semiconductor substrate such as a silicon single-crystal substrate and a compound semiconductor substrate, a glass substrate or the like. Furthermore, at least one of the substrates 121 that are to be stacked onto each other may contain a plurality of elements. In addition, either or both of the substrates 121 that are to be stacked onto each other may itself be a multilayered substrate 123 that has been manufactured by stacking the substrates 121.

The housing 110 airtightly encloses therein the loader 130, the holder stocker 140, the pre-aligner 160, the aligner 170, the bender 180 and the pressing apparatus 190. Thus, the transport path of the substrates 121 in the multilayered substrate manufacturing apparatus 100 can be kept clean. Here, the internal atmosphere within the housing 110 may be replaced with a purging gas such as nitrogen. Furthermore, the internal space within the housing 110 may be entirely or partially evacuated so that some of the loader 130, the holder stocker 140, the pre-aligner 160, the aligner 170, the bender 180 and the pressing apparatus 190 may operate within a vacuum environment.

The loader 130 includes a fork 132, an anti-drop stopper 134, and a folding arm 136. One end of the folding arm 136 is rotatably supported on the housing 110. The other end of the folding arm 136 supports the fork 132 and the anti-drop stopper 134 in such a manner that the fork 132 and the anti-drop stopper 134 can rotate on the vertical and horizontal axes.

A substrate 121 is loaded on the fork 132. The loader 130 can transport the substrate 121 held on the fork 132 to a given position through a combination of bending of the folding arm 136 and rotation of the fork 132.

The anti-drop stopper 134 is held out below the fork 132 when the fork 132 is turned over around the horizontal axis to hold the substrate 121 facing down. In this manner, the substrate 121 is prevented from dropping. When the fork 132 is not turned over, the anti-drop stopper 134 remains retreated at a position where the anti-drop stopper 134 does not interfere with the substrate 121 on the fork 132.

The loader 130 transports the substrates 121 from the FOUPs 120 to the pre-aligner 160. The loader 130 also transports the multilayered substrate 123 that has been taken out of the pressing apparatus 190 to the FOUPs 120. The loader 130 is an example of a transporter.

The loader 130 also transports substrate holders 150 from the holder stocker 140 to the pre-aligner 160, from the pre-aligner 160 to the aligner 170, and from the aligner 170 to the pressing apparatus 190. The substrate holder stocker 140 houses therein a plurality of substrate holders 150. After used, the substrate holders 150 are returned to the substrate holder stocker 140.

The pre-aligner 160 allows the substrate holder 150 to hold the substrate 121 so that the substrate 121 can move together with the substrate holder 150. In other words, the thin and fragile substrate 121 is held in the highly rigid and strong substrate holder 150 and treated integrally, so that the substrate 121 can be easily treated within the multilayered substrate manufacturing apparatus 100.

The pre-aligner 160 has an alignment mechanism that attaches more weight to the speed than to the accuracy, and allows the substrates 121 to be loaded onto varying positions on the substrate holders 150 within a predetermined range. This can shorten the time required to complete the alignment at the aligner 170 described later.

The aligner 170 aligns a pair of substrates 121 to each other and then stacks the substrates 121 on one another. The aligner 170 is required to achieve high alignment accuracy. For example, when stacking semiconductor substrates each of which have elements formed thereon, the aligner 170 is required to achieve accuracy on the order of submicrons, which is almost as small as the gap between the interconnections of the elements. The aligner 170 will be described later with reference to other drawings. After aligning a pair of substrates 121, the aligner 170 may bring the substrates into contact and stack the substrates onto each other, but alternatively may allow the substrates 121 to be held with a space therebetween by coupling a pair of substrate holders 150.

The pressing apparatus 190 strongly presses a pair of substrates 121 that have been aligned and stacked on each other by the aligner 170 so that the substrates 121 are permanently jointed. The stacked substrates 121 provide a single multilayered substrate 123. When pressing the substrates 121, the pressing apparatus 190 may also heat the substrates 121.

Figure 2:
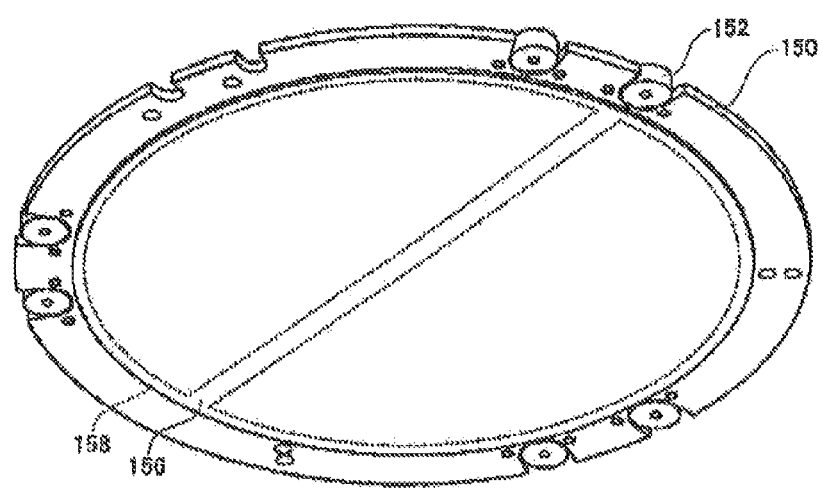
FIG. 2 is a perspective view of a substrate holder 150.

FIG. 2 is a perspective view illustrating, from below, the substrate holder 150 facing down. The substrate holder 150 is a disk-like member having a circular placement surface 156, which is configured to come in contact with and hold the substrate 121, and made of a hard material such as alumina ceramics. The substrate holder 150 includes an electrostatic chuck 158 that is configured to electrostatically attract the substrate 121 to the placement surface 156 when an embedded electrode is applied with a voltage.

The substrate holder 150 further has a plurality of permanent magnets 152 arranged along its periphery. The permanent magnets 152 are secured onto the edge of the substrate holder 150 outside the placement surface 156.

Figure 3:
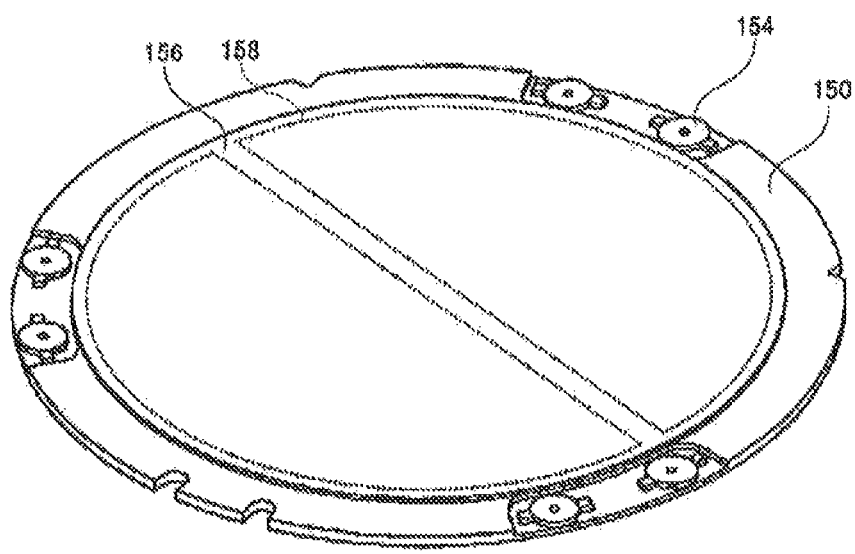
FIG. 3 is a perspective view of the substrate holder 150.

FIG. 3 is a perspective view illustrating, from above, another substrate holder 150 facing up. This substrate holder 150 has the same shape and structure as the substrate holder 150 shown in FIG. 2 in that the placement surface 156 and the electrostatic chuck 158 are provided.

The substrate holder 150 shown in FIG. 3 has magnetic plates 154 in place of the permanent magnets 152. The magnetic plates 154 are arranged so as to correspond to the permanent magnets 152. Each magnetic plate 154 is elastically attached onto the substrate holder 150 so as to be capable of moving in the normal direction of the placement surface 156. Thus, when the substrate holder 150 shown in FIG. 2 is stacked onto the substrate holder 150 shown in FIG. 3 in a manner to face each other, the permanent magnets 152 attract the magnetic plates 154 and the substrate holders 150 remain stacked on each other in a self-sustaining manner.

Figure 4:
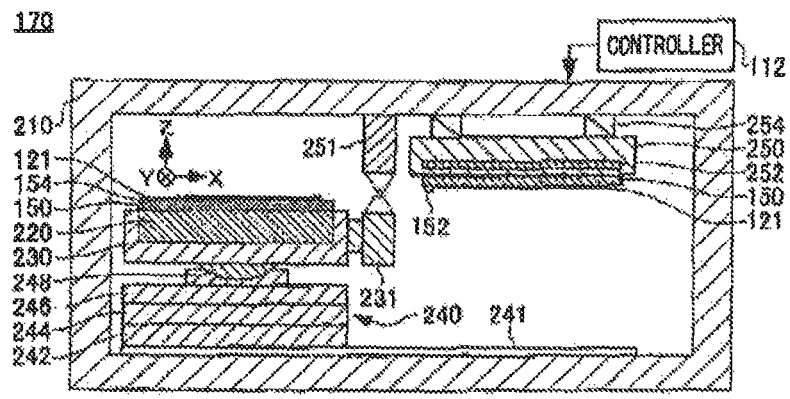
FIG. 4 is a schematic cross-sectional view of an aligner 170.

FIG. 4 is a schematic vertical cross-sectional view of the aligner 170. The aligner 170 includes a frame member 210 and a movable stage 240 and a fixed stage 250 arranged within the frame member 210.

The fixed stage 250 is suspended from the ceiling surface of the frame member 210 via a plurality of load cells 254 and faces downward. The fixed stage 250 includes an electrostatic chuck 252. Thus, the fixed stage 250 attracts and holds, on its lower surface, the substrate holder 150 that is holding one of the substrates 121 to be bonded to each other.

In the shown example, the fixed stage 250 holds the substrate holder 150 shown in FIG. 2 having the permanent magnets 152. The load cells 254 detect the load applied to the fixed stage 250 upwards from below.

On the ceiling surface of the frame member 210, a microscope 251 is arranged so as to face down and be lateral to the fixed stage 250. The microscope 251 is used to observe the surface of the substrate 121 held by a fine-motion stage 230, which is described later. Since the microscope 251 is secured onto the frame member 210, the relative positions of the microscope 251 and the fixed stage 250 stay the same.

The movable stage 240 includes a movable surface plate 242, a coarse-motion stage 244, a gravity cancelling section 246, a spherical seat 248 and the fine-motion stage 230. The movable surface plate 242 has the coarse-motion stage 244, the gravity cancelling section 246 and the fine-motion stage 230 mounted thereon, and moves along the guide rail 241 secured onto the inner bottom surface of the frame member 210. The movement of the movable surface plate 242 allows the movable stage 240 to be moved between the position immediately below the fixed stage 250 and the position off the fixed stage 250.

The coarse-motion stage 244 moves relative to the movable surface plate 242 in the horizontal direction containing an X-direction component and a Y-direction component indicated by the arrows in FIG. 4. When the coarse-motion stage 244 moves relative to the movable surface plate 242, the fine-motion stage 230 also moves in accordance with the movement of the coarse-motion stage 244.

The gravity cancelling section 246 detects fine movement of the fine-motion stage 230 and expands and shrinks. Thus, the gravity cancelling section 246 reduces the apparent weight of the fine-motion stage 230. This mitigates the load on the actuator designed to move the fine-motion stage 230, thereby improving the position control accuracy.

The fine-motion stage 230 includes a holder 220 and holds the substrate holder 150 that is holding the substrate 121 to be bonded to another substrate 121. For alignment of the substrates 121, the fine-motion stage 230 first moves in accordance with the movement of the coarse-motion stage 244. Subsequently, the fine-motion stage 230 moves relative to the coarse-motion stage 244. The movement of the fine-motion stage 230 relative to the coarse-motion stage 244 includes translation and rotation in all of the X, Y and Z axes.

The fine-motion stage 230 has a microscope 231 that is secured lateral to the fine-motion stage 230. Since the microscope 231 is secured onto the fine-motion stage 230, the relative positions of the fine-motion stage 230 and the microscope 231 remain the same. The microscope 231 is used to observe the surface of the substrate 121 held by the fixed stage 250.

The holder 220 of the fine-motion stage 230 also serves as a deformer for the substrate 121, which independently corrects, in each partial region, the magnification ratio for forming the device regions on the substrate 121. The structure and function of the holder 220 will be described later.

Figure 5:
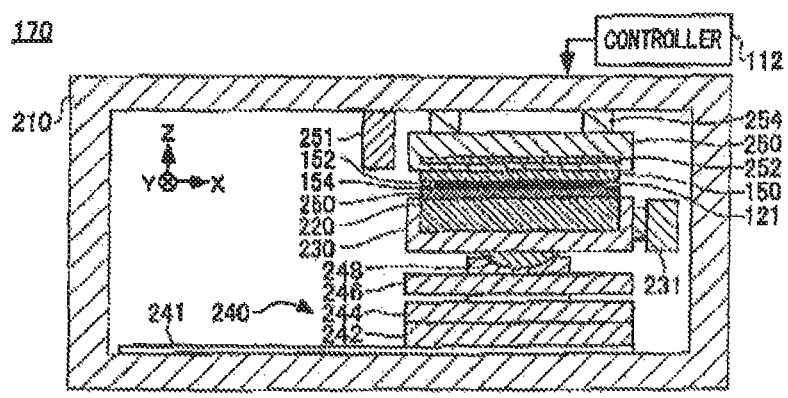
FIG. 5 is a schematic cross-sectional view of the aligner 170.

FIG. 5 is a schematic cross-sectional view of the aligner 170. The common constituents in FIGS. 4 and 5 are assigned the common reference numerals and not explained here.

Referring to the aligner 170 shown in FIG. 5, the movable stage 240 has moved along the guide rail 241, so that the fine-motion stage 230 and the fixed stage 250 face each other while either of them is holding the substrate holder 150 and the substrate 121. After the held substrates are aligned with respect to each other, the fine-motion stage 230 is lifted. Thus, the pair of substrates 121 are stacked and attached onto each other. Before attaching the substrates 121 to each other, the aligner 170 aligns the substrates 121 to each other so that the pads, bumps and the like match in position.

Figure 6:
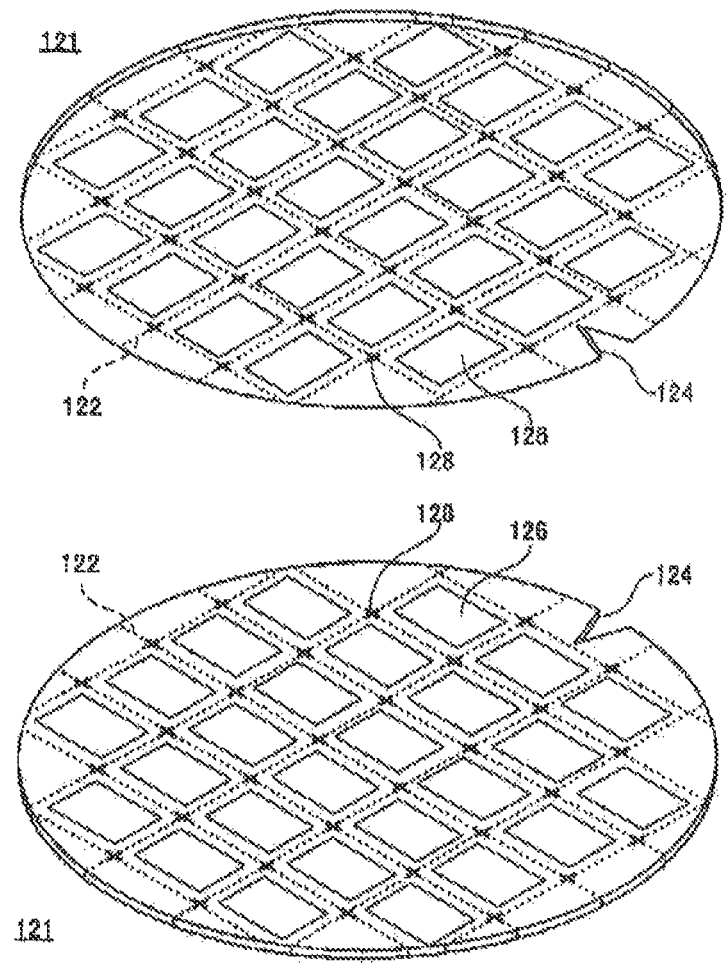
FIG. 6 is a schematic perspective view of substrates 121.

FIG. 6 is a conceptual perspective view illustrating the pair of substrates 121 that face each other and are to be bonded to each other. The substrates 121 each has a disk-like shape partially missing, in other words, having a notch 124. On the surface of each substrate 121, a plurality of device regions 126 and a plurality of alignment marks 128 are provided.

The notches 124 are formed according to the crystallographic orientations of the substrates 121. Therefore, when the substrates 121 are handled, the notches 124 are consulted to know the orientations of the substrates 121.

On the surface of each substrate 121, the device regions 126 are regularly arranged. Each device region 126 has a semiconductor device mounted therein that has been formed by processing the substrate 121 using photolithography and other techniques. Each device region 126 also includes pads and the like that axe configured to serve as connector terminals when the substrate 121 is bonded to the other substrate 121.

There are blank regions between the device regions 126 in which functional elements such as devices, circuits and the like are not provided. In the blank regions, scribe lines 122 are arranged along which the substrate 121 is cut into the separate device regions 126.

On the scribe lines 122, the alignment marks 128 are arranged and used to align the substrate 121 to the other substrate 121. The scribe lines 122 disappear during the step of cutting the substrate 121 into dies due to the width of the blades. Thus, the presence of the alignment marks 128 does not reduce the effective area of the substrate 121.

Although FIG. 6 show large device regions 126 and alignment marks 128, the number of the device regions 126 may actually reach, for example, as large as several hundred or more in the case of the substrate 121 having a diameter of 300 mm. The interconnection patterns and the like formed in the device regions 126 may be used as the alignment marks 128.

Figure 7:
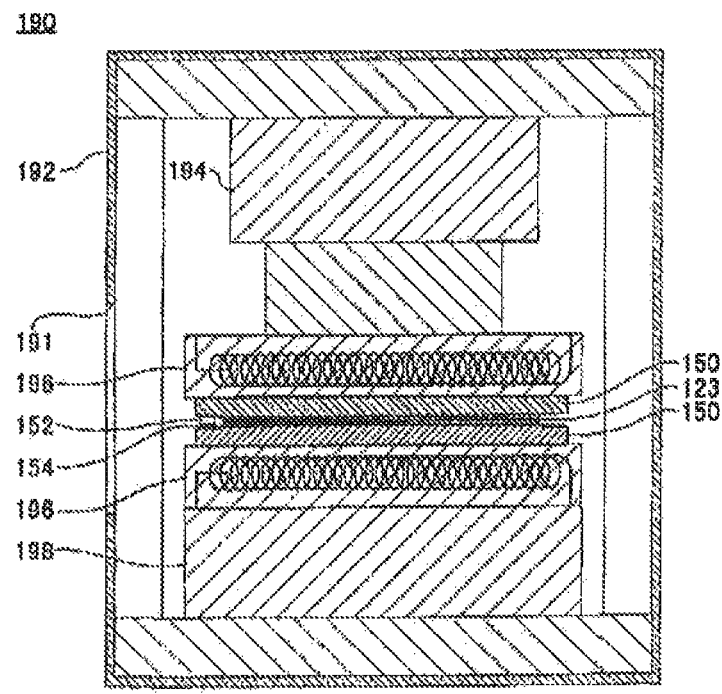
FIG. 7 is a schematic cross-sectional view of a pressing apparatus.

FIG. 7 is a schematic cross-sectional view of the pressing apparatus 190. The pressing apparatus 190 includes a surface plate 198 and a heat plate 196 that are sequentially stacked on the bottom of a housing 192, and a press-down section 194 and a heat plate 196 that hang from the ceiling surface of the housing 192. Each heat plate 196 has a heater therein. Furthermore, a loading entrance 191 is provided on one of the lateral surfaces of the housing 192.

The pair of substrates 121 that have been aligned to each other and stacked onto each other and the pair of substrate holders 150 that sandwich the pair of substrates 121 therebetween are loaded into the pressing apparatus 190. After loaded into the pressing apparatus 190, the substrate holders 150 and the substrates 121 are placed on the upper surface of the heat plate 196 on the surface plate 198.

The pressing apparatus 190 first raises the temperature of the heat plates 196 and then allows the press-down section 194 to go down to press down the upper heat plate 196. Thus, the substrate holders 150 and the substrates 121 sandwiched between the heat plates 196 are heated and pressed to be bonded to each other, so that the pair of substrates 121 are formed into a multilayered substrate 123. In the multilayered substrate 123, the pads on the substrates 121 are electrically interconnected to each other through the solder bumps and the like formed on at least one of the substrates 121. In the above-described manner, the multilayered substrate 123 can be formed in which the devices on the respective substrates 121 are interconnected. The resulting multilayered substrate 123 is stored by the loader 130 into the FOUPs 120.

Considering the above-mentioned step, the substrate holders 150 are required to have sufficient strength and heat resistance to prevent the substrate holders 150 from being degraded by repetitive heating and pressing steps by the pressing apparatus 190. When the heat plates 196 provide high-temperature heating, the surfaces of the substrates 121 may chemically react with the surrounding atmosphere. Thus, when the substrates 121 are heated and pressed, the housing 192 is preferably evacuated to have a vacuum environment therein. Accordingly, an openable and closable door may be provided to airtightly close the loading entrance 191.

The pressing apparatus 190 may further include a cooler to allow the multilayered substrate 123 that has been formed through the heating and pressing steps to cool down. In this way, the multilayered substrate 123 can be taken out and returned to the FOUPs 120 quickly after cooled down to some extent, if not down to room temperature.

FIGS. 8, 9, 10 and 11 show the transition of the states of the substrates 121 in the multilayered substrate manufacturing apparatus 100. The following describes how the multilayered substrate manufacturing apparatus 100 is operated with reference to FIGS. 8, 9, 10 and 11.

The substrates 121 to be subjected to the bonding process are loaded into the multilayered substrate manufacturing apparatus 100 while being housed within the FOUPs 120. In the multilayered substrate manufacturing apparatus 100, the loader 130 first takes out the substrate holder 150 from the holder stocker 140 and then places the substrate holder 150 on the pre-aligner 160.

Here, the position of the substrate holder 150 on the pre-aligner 160 is adjusted. Accordingly, the substrate holder 150 is aligned and positioned on the pre-aligner 160 with accuracy of a predetermined level or higher.

Following this, the loader 130 takes out the substrates 121 one by one from the FOUPs 120 and transports each substrate 121 to the pre-aligner 160. In the pre-aligner 160, the substrate 121 is loaded onto the substrate holder 150 with accuracy of a predetermined level or higher with respect to the substrate holder 150.

Figure 8:
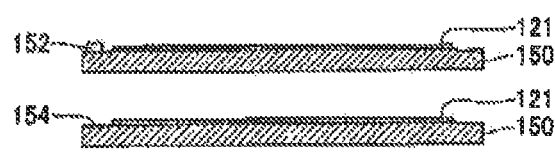
FIG. 8 is a cross-sectional view showing the transition of the states of the substrates 121.

Thus, the substrate holder 150 holds the substrate 121 as shown in FIG. 8. The substrate holder 150 having the substrate 121 loaded thereon is sequentially transported by the loader 130 to the aligner 170. In this manner, after transported, the first pair of the substrate 121 and the substrate holder 150 is turned over by the loader 130 and held by the fixed stage 250, for example.

Figure 9:
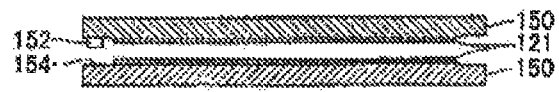
FIG. 9 is a cross-sectional view showing the transition of the states of the substrates 121.

The subsequent pair of the substrate 121 and the substrate holder 150 is held by the fine-motion stage 230 without being turned over, after transported. Thus, the substrates 121 are held within the aligner 170 while facing each other as shown in FIG. 9.

Figure 10:
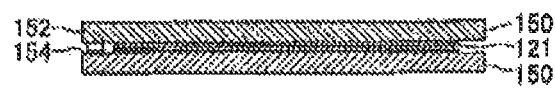
FIG. 10 is a cross-sectional view showing the transition of the states of the substrates 121.

After this, the aligner 170 aligns the substrates 121 to each other and brings the substrates 121 into close contact with each other. At this stage, the substrates 121 are not yet permanently bonded to each other. However, since the permanent magnets 152 provided on one of the substrate holders 150 attract the magnetic plates 154 of the other substrate holder 150, the state in which the substrate holders 150 sandwich the substrates 121 in close contact with each other therebetween is maintained in a self-sustaining manner as shown in FIG. 10. Therefore, the loader 130 can integrally transport the substrate holders 150 sandwiching the substrates 121 therebetween.

Figure 11:
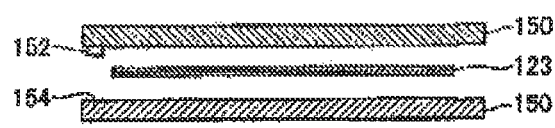
FIG. 11 is a cross-sectional view showing the transition of the states of the substrates 121.

Subsequently, the loader 130 loads the substrate holders 150 sandwiching the substrates 121 therebetween into the pressing apparatus 190. After heated and pressed in the pressing apparatus 190, the substrates 121 are permanently bonded to each other and formed into the multilayered substrate 123 as shown in FIG. 11. Following this, the loader 130 separates the multilayered substrate 123 from the substrate holders 150, and transports the substrate holders 150 to the holder stocker 140 and transports the multilayered substrate 123 to the FOUPs 120. In this way, a series of steps to manufacture the multilayered substrate 123 is completed. After this, the multilayered substrate 123 is divided into separate multilayered semiconductor devices.

When the substrates 121 are aligned to each other by the aligner 170 during the above-described series of steps, the aligner 170 shown in FIGS. 4 and 5 uses the microscopes 231 and 251 to observe the alignment marks 128 on the substrates 121 facing each other and to measure the positions of the substrates 121 relative to each other. Furthermore, the aligner 170 moves the fine-motion stage 230 in a manner to remove the difference between the relatively measured positions. In this way, the substrates 121 can be aligned to each other.

Here, even when manufactured by the same apparatus using the same mask, the substrates 121 may have different magnification ratios for the device regions 126 formed on the substrates 121 due to, for example, differences in environmental conditions such as the temperature during the photolithography step. When having different magnification ratios for the device regions 126, the substrates 121 cannot be aligned to each other simply by changing their relative positions. To solve this problem, the multilayered substrate manufacturing apparatus 100 relating to the present embodiment corrects the magnification ratios for the device regions 126 by bending the substrates 121 with the use of the bender 180.

Figure 12:
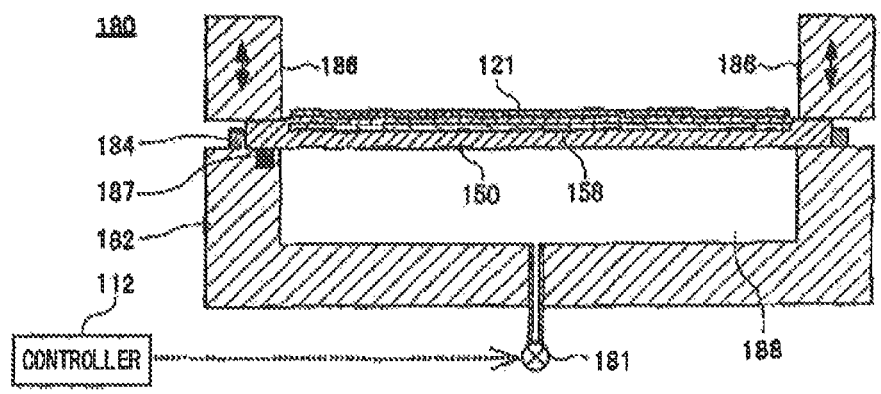
FIG. 12 is a schematic cross-sectional view of a bender 180.

FIG. 12 is a schematic cross-sectional view of the bender 180. The bender 180 is used to correct the magnification ratios for the device regions 126 across the substrates 121.

The bender 180 includes a support 182 and a gripper 186. The support 182 is shaped like a cylinder having an open upper end. The edge of the upper end surface of the support 182 comes into contact with the lower surface of the substrate holder 150 to support the substrate holder 150. Furthermore, a power supply terminal 187 is provided on the upper end surface of the support 182. A voltage is applied to drive the electrostatic chuck 158 of the substrate holder 150 through the power supply terminal 187.

Since the upper end surface of the support 182 has an annular shape, the upper end surface is not in contact with the lower surface of the placement surface 156 of the substrate holder 150. Thus, when the substrate holder 150 is placed on the support 182, an air chamber 188 is formed within the support 182 and defined by the inner surface of the support 182 and the lower surface of the substrate holder 150.

The air chamber 188 is connected to a pressure source through a valve 181. The valve 181 allows the air chamber 188 to be in communication with a positive or negative pressure source under the control of the controller 112. The air chamber 188, the valve 181 and the pressure source form an actuator.

A plurality of positioning pins 184 are arranged on the upper surface of the support 182. The positioning pins 184 are provided at at least two locations on the annular upper end surface of the support 182. In this manner, when placed on the upper surface of the support 182, the substrate holder 150 can be positioned so as to be coaxial with the support 182 by allowing the substrate holder 150 to abut the positioning pins 184 laterally.

The gripper 186 presses down the edge of the substrate holder 150 placed on the support 182 from above. In this manner, the substrate holder 150 is gripped between the support 182 and the gripper 186.

Figure 13:
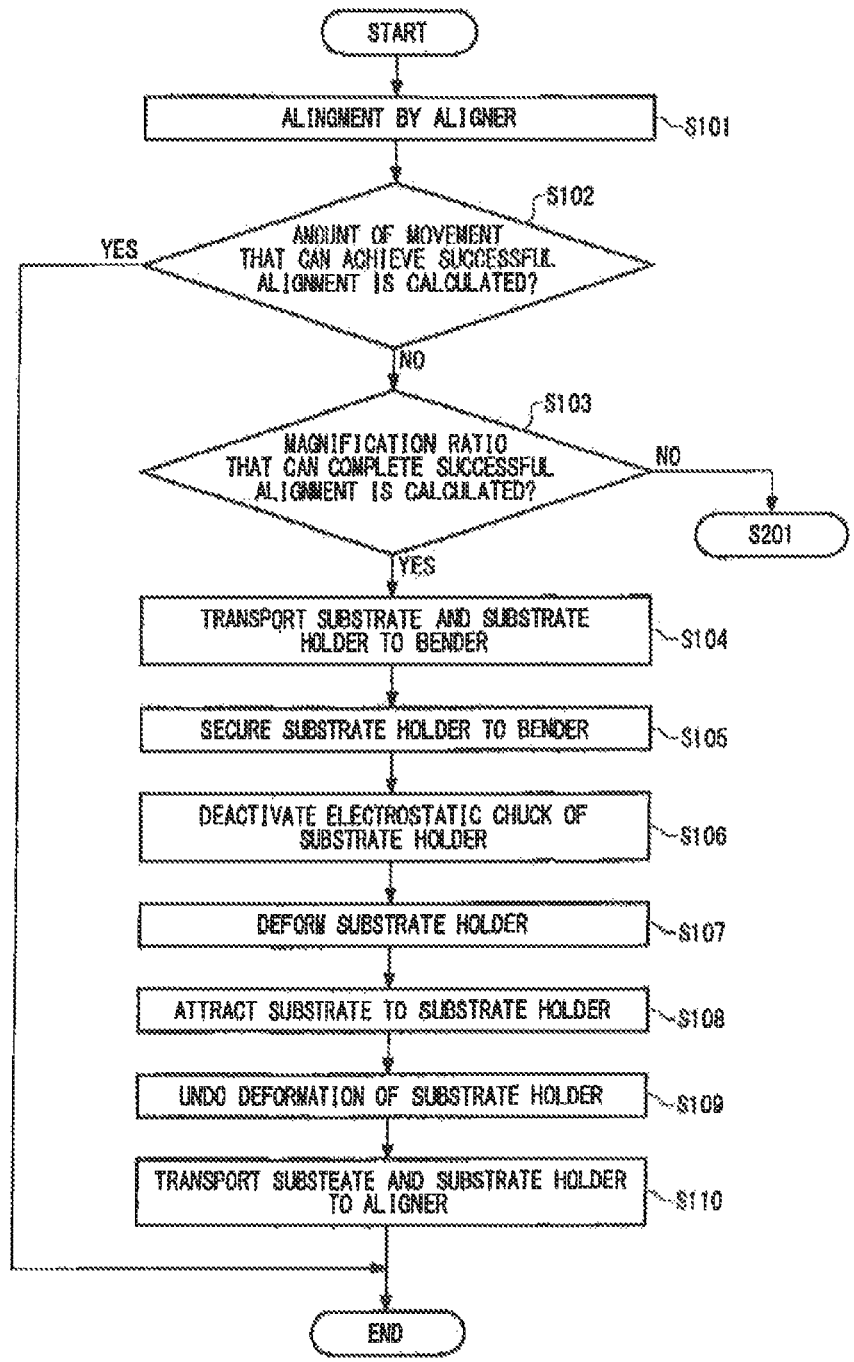
FIG. 13 is a flow diagram showing how the bender 180 holds the substrates 121.

FIG. 13 is a flow diagram illustrating how the bender 180 operates. FIGS. 14 to 21 schematically illustrate the transition of the states of the substrate holder 150 and the substrate 121 caused by the operation of the bender 180 and are referred to as appropriate in the following description.

To use the bender 180, first of all, the loader 130 loads the substrate holders 150 respectively holding the substrates 121 into the aligner 170, and the aligner 170 aligns the substrates 121 to each other, as shown in FIG. 13 (step S101). If the substrates 121 can be aligned by the aligner 170 with accuracy within a permissible range, the substrates 121 and the substrate holders 150 are transported to the pressing apparatus 190. Therefore, the controller 112 terminates the controls relating to the bender 180 (step S102:YES).

On the contrary, if the substrates 121 cannot be aligned with accuracy within a permissible range even by moving the fine-motion stage 230 (step S102:NO), the controller 112 calculates whether changing the magnification ratios for the device regions 126 on one of the substrates 121 can improve the alignment accuracy up to the predetermined permissible range (step S103).

If the result of the calculation indicates that there is a solution that can achieve the desirable alignment accuracy by changing the magnification ratios for the device regions 126 on one of the substrates 121 (step S103:YES), the controller 112 performs a magnification ratio changing operation on the substrate 121. Specifically speaking, the controller 112 control the loader 130 to transport the substrate 121 and the substrate holder 150 that are held by the fine-motion stage 230 to the bender 180 (step S104).

Specifically speaking, the controller 112 controls the loader 130 to transport the substrate 121 and the substrate holder 150 to the bender 180, to position the substrate 121 and the substrate holder 150 using the positioning pins 184 and to place the substrate 121 and the substrate holder 150 on the support 182. Subsequently, the controller 112 allows the gripper 186 to move down so that the substrate holder 150 is fixed onto the bender 180 (step S105). Furthermore, the controller 112 deactivates the electrostatic chuck 158 of the substrate holder 150 (step S106) so that the substrate 121 is placed on the substrate holder 150 but not attracted by the substrate holder 150.

Figure 14:
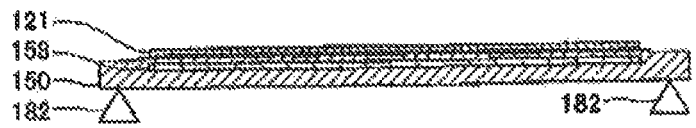
FIG. 14 is a cross-sectional view illustrating the transition of the states of the substrate 121 and the substrate holder 150.

As shown in FIG. 14, the substrate holder 150 is fixed flatly by the support 182. Here, the substrate 121 is merely placed on the upper surface of the substrate holder 150 without being attracted. Subsequently, the controller 112 controls the valve 181 to allow the air chamber 188 within the support 182 to be in communication with a negative pressure source (step S107).

Figure 15:
FIG. 15 is a cross-sectional view illustrating the transition of the states of the substrate 121 and the substrate holder 150.

In this manner, as shown in FIG. 15, the lower surface of the substrate holder 150 is suctioned by the negative pressure, so that the central portion of the substrate holder 150 moves down in the direction orthogonal to the placement surface 156. Accordingly, the entire substrate holder 150 is deformed. Here, the attraction of the substrate 121 by the substrate holder 150 is deactivated (step S106). Therefore, the substrate 121 is placed on the substrate holder 150 without being deformed. This means that the central portion of the substrate 121 is spaced away from and hot supported by the substrate holder 150.

Figure 16:
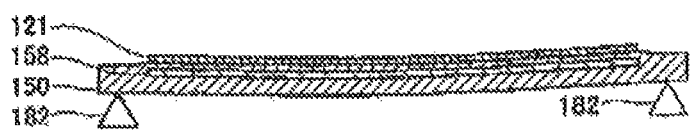
FIG. 16 is a cross-sectional view illustrating the transition of the states of substrate 121 and the substrate holder 150.

Following this, the controller 112 applies a voltage to the electrostatic chuck 158 of the substrate holder 150, so that the substrate holder 150 attracts the substrate 121 (step S108). Accordingly, the substrate 121 is deformed in a similar manner to the substrate holder 150 as shown in FIG. 16, so that the lower surface of the substrate 121 comes into close contact with the placement surface 156 of the substrate holder 150.

Figure 17:
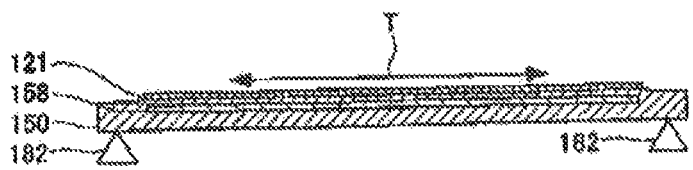
FIG. 17 is a cross-sectional view illustrating the transition of the states of the substrate 121 and the substrate holder 150.

After this, the controller 112 controls the valve 181 to allow the air chamber 188 to be in communication with the atmospheric pressure. This deactivates the suction of the substrate holder 150 by the negative pressure, allows the substrate holder 150 to gain a restoring force due to its own elasticity and "inversely deforms" the substrate holder 150 in a given direction to return to its flat state as shown in FIG. 17 (step S109).

Here, the substrate holder 150, which is significantly thicker than the substrate 121, has higher bending rigidity than the substrate 121. Furthermore, the entire lower surface of the substrate 121 is in contact with the placement surface 156 of the substrate holder 150. The deformation of the substrate holder 150 that is caused by the restoring force bends the substrate 121. Therefore, as shown in FIG. 17 by the arrow T, stress to horizontally expand the substrate 121 in the plane direction of the substrate 121 acts on the substrate 121. This increases the magnification ratios for the device regions 126.

Note that the substrate holder 150 is inversely deformed together with the substrate 121 while maintaining the attraction of the substrate 121 by causing the electrostatic chuck 158 to continue to attract the substrate 121. Therefore, the restoring force caused by the inversely deforming substrate holder 150 is affected by the sum of the bending rigidity of the substrate holder 150 and the bending rigidity of the substrate 121.

Accordingly, the flatness of the substrate 121 observed after the deformation of the substrate holder 150 by the support 182 is deactivated is different from the flatness of the substrate holder 150 observed after only the substrate holder 150 is deformed and then inversely deformed. Therefore, the amount of the deformation of the substrate holder 150 is preferably determined such that a target magnification ratio for the device regions 126 is achieved considering the bending rigidity of the substrate 121.

After the state shown in FIG. 17, the controller 112 controls the loader 130 to load the substrate 121 and the substrate holder 150 again into the aligner 170 while maintaining the attraction of the substrate 121 by the electrostatic chuck 158 (step S110). Since the difference, between the magnification ratios for the device regions 126 has been corrected in the above-described manner, the aligner 170 can align the substrates 121 with higher accuracy than before one of the substrates 121 is deformed by the bender 180.

Here, the substrate wider 150 applies tension to the entire lower surface of the substrate 121. Therefore, no stress concentration occurs in the substrate 121. Accordingly, the entire substrate 121 is expanded to increase the magnification ratios for the device regions 126.

When the substrate 121 is attracted again in the step S108, there is a large gap between the substrate holder 150 and the substrate 121 to be attracted if the substrate holder 150 is significantly deformed. If the substrate holder 150 is significantly deformed, the deactivation of the deformation of the substrate in the step S109 causes higher stress to act on the substrate 121. Therefore, as the amount of the deformation of the substrate holder 150 increases, the attracting force generated by the substrate holder 150 is preferably increased.

Figure 18:
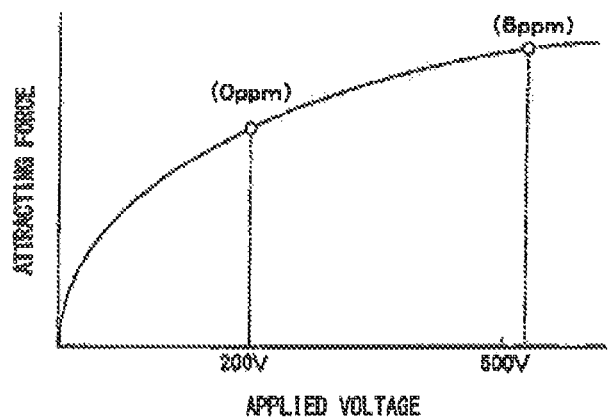
FIG. 18 is a graph illustrating the relation between an applied voltage and a holding force.

FIG. 18 is a graph showing the relation between the voltage applied to the electrostatic chuck 158 of the substrate holder 150 and the holding force exerted by the electrostatic chuck 158 to hold the substrate 121. As seen from FIG. 18, as the voltage applied to the electrostatic chuck 158 increases, the holding force exerted by the electrostatic chuck 158 increases.

For example, a case is considered where a silicon monocrystalline substrate 121 having a diameter of 300 mm is held by a substrate holder 150 whose placement surface 156 has a friction coefficient of approximately 0.3. In this case, even when the central portion of the substrate holder 150 is deformed by approximately 5 ppm, the substrate holder 150 can continue to hold the substrate 121 as long as the attracting force is 169.9 kPa or more. Such an attracting force can be generated by applying to the electrostatic chuck 158 a voltage that is approximately 2.5 times higher than a voltage necessary to cause a flat substrate holder 150 to hold a flat substrate 121. For example, when a voltage of 200 V is applied to hold a flat substrate 121, a voltage of approximately 500 V, preferably, approximately 1000 V may be applied to the electrostatic chuck 158 to generate the above-mentioned attracting force necessary to continue to hold the deformed substrate 121.

If the application of the voltage is stopped, the attracting force of the electrostatic chuck 158 gradually drops. Therefore, even if the application of the voltage is suspended for a short period of time to pass the substrate holder 150 onto the loader, the attraction of the substrate 121 by the substrate holder 150 is generally maintained.

Figure 19:
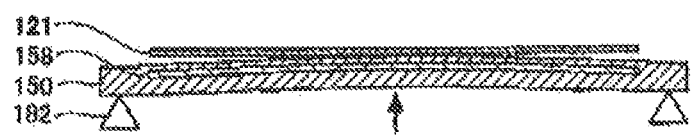
FIG. 19 is a cross-sectional view illustrating the transition of the states of the substrate 121 and the substrate holder 150.
Figure 20:
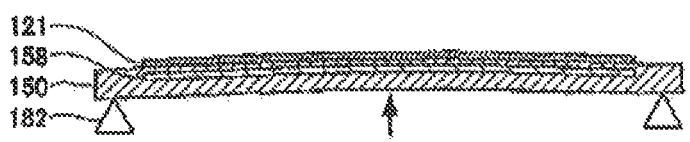
FIG. 20 is a cross-sectional view illustrating the transition of the states of the substrate 121 and the substrate holder 150.
Figure 21:
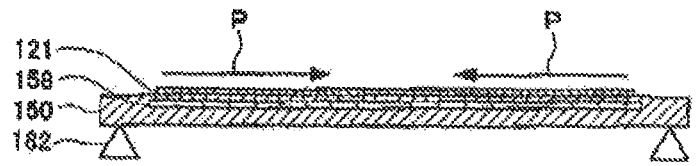
FIG. 21 is a cross-sectional view illustrating the transition of the states of the substrate 121 and the substrate holder 150.

FIGS. 19, 20 and 21 show the transition of the states of the substrate 121 and the substrate holder 150 when the controller 112 allows the air chamber 188 to be in communication with a positive pressure via the valve 181. The following description is made with reference to the procedure shown in FIG. 13 as appropriate.

In the step S106, the controller 112 deactivates the electrostatic chuck 158 of the substrate holder 150 so that the substrate 121 is placed on the substrate holder 150 but not attracted by the substrate holder 150. Subsequently, the controller 112 controls the valve 181 to allow the air chamber 188 within the support 182 to be in communication with a positive pressure source (step S107).

In this manner, as shown in FIG. 19, the lower surface of the substrate holder 150 is pressed upwards by the positive pressure. Thus, the central portion of the substrate holder 150 moves up in the direction orthogonal to the placement surface 156. Accordingly, the entire substrate holder 150 is deformed. Here, the attraction of the substrate 121 by the substrate holder 150 is deactivated (step S105). Therefore, the substrate 121 is placed on the substrate holder 150 without being deformed. This means that the edge portion of the substrate 121 is spaced away from and not supported by the substrate holder 150.

Following this, the controller 112 applies a voltage to the electrostatic chuck 158 of the substrate holder 150, to attract the substrate 121 (step S108). Accordingly, the substrate 121 is deformed in a similar manner to the substrate holder 150 as shown in FIG. 20. Consequently, the lower surface of the substrate 121 comes into close contact with the placement surface 156 of the substrate holder 150.

After this, the controller 112 controls the valve 181 to allow the air chamber 188 to be in communication with the atmospheric pressure. This deactivates the suction of the substrate holder 150 by the negative pressure, allows the substrate holder 150 to gain a restoring force due to its own elasticity, and "inversely deforms" the substrate holder 150 in a given direction to return to its flat state as shown in FIG. 21 (step S109).

Note that the substrate holder 150 is inversely deformed together with the substrate 121 while attracting the substrate 121 by causing the electrostatic chuck 158 to continue to attract the substrate 121. Therefore, the restoring force caused by the inversely deforming substrate holder 150 is affected by the sum of the bending rigidity of the substrate holder 150 and the bending rigidity of the substrate 121.

Here, the substrate holder 150, which is significantly thicker than the substrate 121, has higher bending rigidity than the substrate 121. Furthermore, the entire lower surface of the substrate 121 is in contact with the placement surface 156 of the substrate holder 150. The deformation caused by the restoring force of the substrate holder 150 bends the substrate 121. Therefore, as shown in FIG. 21 by the arrow P, stress to horizontally shrink the substrate 121 in the plane direction, of the substrate 121 acts on the substrate 121. This decreases the magnification ratios for the device regions 126.

After this, the controller 112 controls the loader 130 to load the substrate 121 and the substrate holder 150 again into the aligner 170 while maintaining the attraction of the substrate 121 by the electrostatic chuck 158 (step S110). Since the difference between the magnification ratios for the device regions 126 has been corrected in the above-described manner, the aligner 170 can align the substrates 121 with higher accuracy than a predetermined level.

When the substrate 121 is attracted again in the step S108, there is a large gap between the placement surface 156 and the substrate 121 in the edge portion of the substrate holder 150. Therefore, in the edge region, the voltage applied to the electrostatic chuck 158 is preferably higher than in the other region. This enables the entire substrate 121 to be attracted onto the placement surface 156.

In the above-described manner, the aligner 170 can align and stack the substrates 121 even if the substrates 121 are different from each other in terms of the magnification ratios for the device regions 126. Here, the controller 112 stores therein a table in which the amounts of the driving of the actuator formed by the bender 180 are associated with the amounts of the correction of the misalignment between the substrates 121. More specifically, the table shows the values of the negative or positive pressure in association with the amounts of the correction of the misalignment between the substrates 121. The controller 112 refers to the table to identify the amount of the driving that is associated with the amount of the correction of the misalignment that can achieve the desired alignment accuracy and drives the actuator, specifically speaking, the valve 181 in accordance with the identified amount of the driving.

In the step S103, there may be a case where the result of the calculation indicates that there is no solution that can achieve the alignment accuracy within the desired permissible range by changing the magnification ratios for the device regions 126 in one of the substrates 121 (step S103:NO), in other words, during the manufacturing process of the substrate 121, the substrate 121 may be partially deformed when photolithography is repetitively performed to form the device regions 126. If photolithography is further repetitively performed on the substrate 121 that is partially deformed, the magnification ratios for the device regions 126 may vary within the single substrate 121.

If such is the case, it is not possible to calculate the amount of the movement of the fine-motion stage 230 that can remove the misalignment between the substrates 121 that are attempted to be aligned to each other by referring to the alignment marks 128. Furthermore, global correction of the magnification ratios for the device regions 126 across the substrate 121 still cannot accomplish alignment accuracy within a predetermined range. In this case, the controller 112 uses the holder 220 to partially change the magnification ratios.

Figure 22:
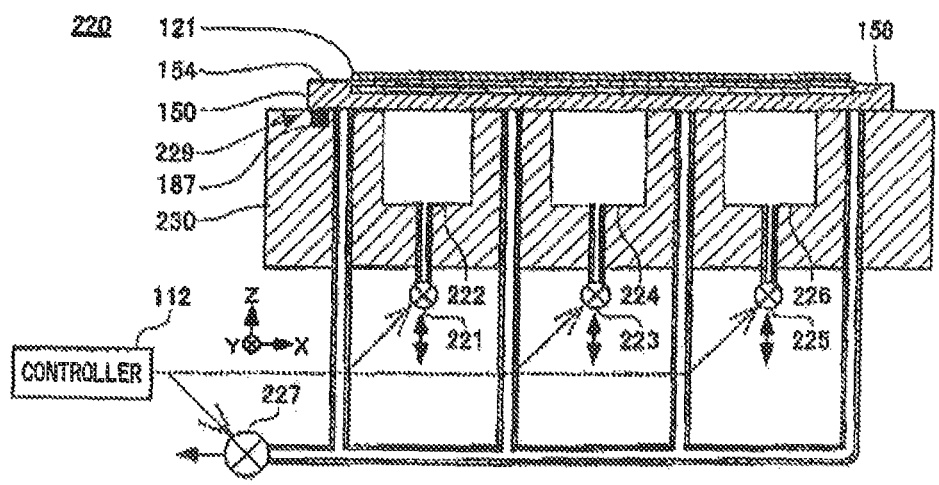
FIG. 22 is a schematic cross-sectional view illustrating a holder 220.

FIG. 22 is a schematic cross-sectional view illustrating the holder 220 integrated into the fine-motion stage 230. The holder 220 has a function of holding the substrate holder 150 on the fine-motion stage 230. The holder 220 is also used to correct the magnification ratios for the device regions 126 in part of the substrate 121.

The holder 220 includes a vacuum chuck 229 and a plurality of air chambers 222, 224 and 226. The vacuum chuck 229 includes a valve 227 in communication with openings that go through the fine-motion stage 230 and are open at the upper surface of the fine-motion stage 230. The valve 227 controls whether the openings are in communication with or blocked from a negative pressure source.

The air chambers 222, 224 and 226 are respectively in communication with valves 221, 223 and 225 that are independently openable and closable. Under the control of the controller 112, the valves 221, 223 and 225 respectively allow the air chambers 222, 224 and 226 to be in communication with a positive or negative pressure source. Together with the pressure source, each of the air chambers 222, 224 and 226 and a corresponding one of the valves 221, 223 and 225 form an actuator.

Figure 23:
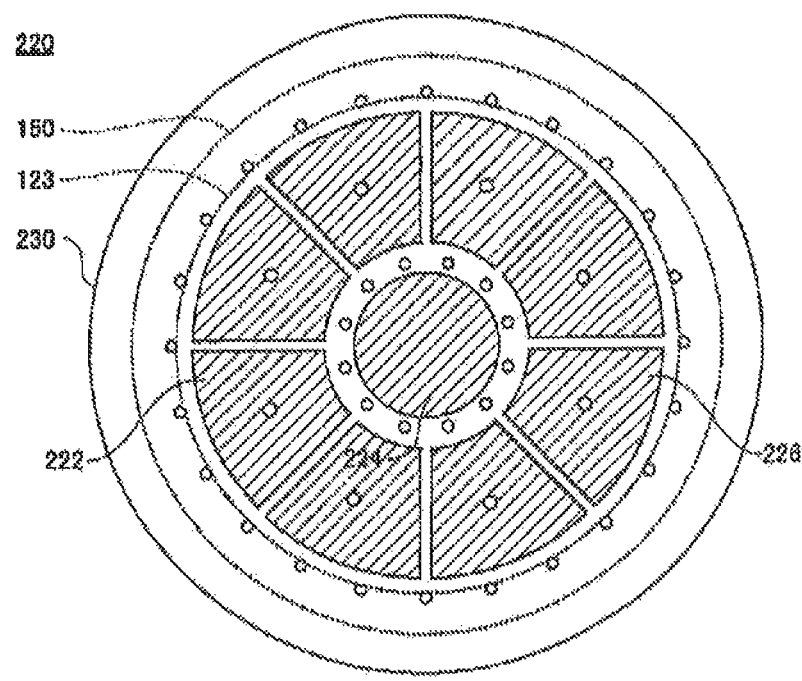
FIG. 23 is a plan view of a fine-motion stage 230.

FIG. 23 is a plan view illustrating the fine-motion stage 230 including the holder 220. The common constituents between FIGS. 22 and 23 are assigned with the same reference numerals and not described here.

As shown in FIGS. 22 and 23, each of the air chambers 222, 224 and 226 is separately open at the upper surface of the fine-motion stage 230. Therefore, when the substrate holder 150 is placed on the fine-motion stage 230, the air chambers 222, 224 and 226 are respectively closed by different partial regions of the substrate holder 150.

Figure 24:
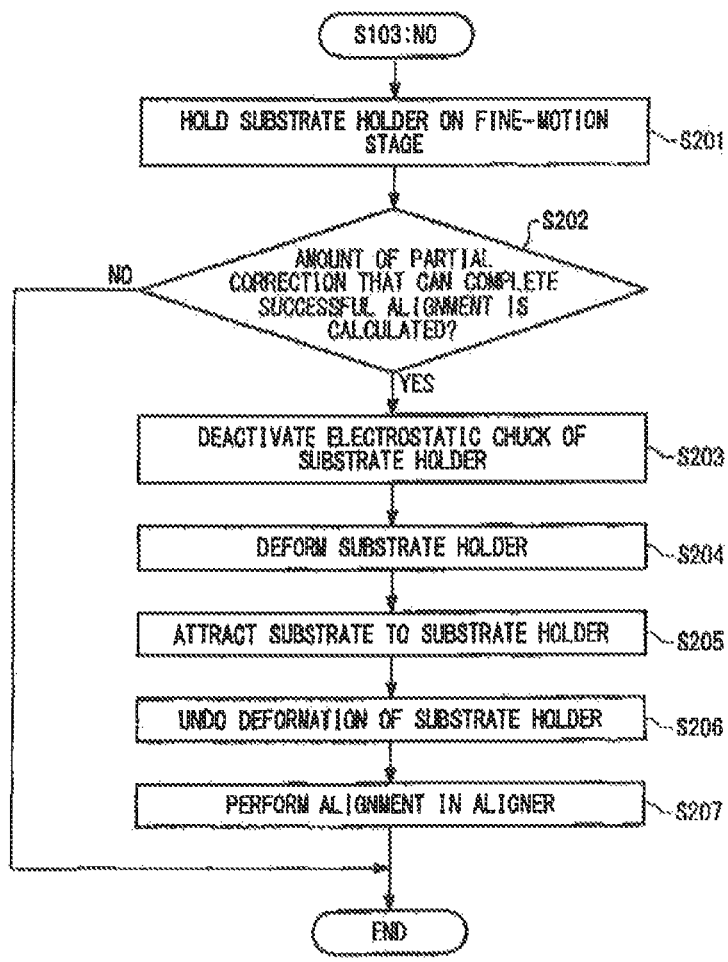
FIG. 24 is a flow diagram illustrating how the holder 220 holds the substrate 121.

FIG. 24 is a flow diagram illustrating how the holder 220 operates. The series of operations shown in FIG. 24 are subsequent to the step S103 in FIG. 13 if negative judgment is made. FIGS. 25 to 28 schematically illustrate the states of the substrate holder 150 and the substrate 121 observed in accordance with the operations of the holder 220 and are referred to as appropriate in the following description.

As shown in FIG. 24, the controller 112 controls the vacuum chuck 229 of the holder 220 to hold the substrate holder 150 on the fine-motion stage 230 (step S201). After this, the controller 112 identifies the partial regions of the substrate 121 that need to be corrected and calculates the amount of the correction in the identified regions in order to accomplish alignment accuracy within a predetermined permissible range by correcting the magnification ratios for forming the device regions 126 in the identified partial regions (step S202).

If the results of the calculation indicates there is no solution for the amount of the correction (step S202:NO), the controller 112 suspends the bonding process for the substrate. In this case, the substrate 121 that is placed on the fine-motion stage 230 may be replaced, or the substrate 121 held by the fixed-stage 250 may additionally be replaced.

In either case, the controller 112 terminates the series of operations for the substrate 121 that is currently loaded on the fine-motion stage 230. When a new substrate 121 is loaded into the aligner 170, the controller 112 starts the series of operations shown in FIG. 13 from the beginning.

If the result of the calculation indicates that there is a solution that can accomplish predetermined alignment accuracy by partially changing the magnification ratios for the device regions 126 in the substrate 121 (step S202:YES), the controller 112 starts a series of correcting operations for the substrate 121. Specifically speaking, the controller 112 first deactivates the electrostatic chuck 158 of the substrate holder 150 (step S203).

Figure 25:
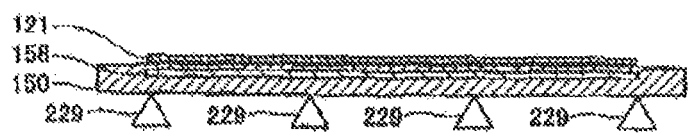
FIG. 25 is a cross-sectional view illustrating the transition of the states of the substrate 121 and the substrate holder 150.

Accordingly, as shown in FIG. 25, the substrate holder 150 on the fine-motion stage 230 is horizontally secured by the vacuum chuck 229. On the other hand, the substrate 121 is merely placed on the substrate holder 150 without being attracted.

Figure 26:
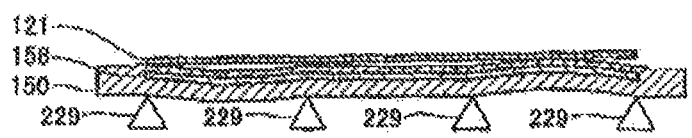
FIG. 26 is a cross-sectional view illustrating the transition of the states of the substrate 121 and the substrate holder 150.

Subsequently, as shown in FIG. 26, the controller 112 controls the valves 221 and 225 to allow the air chamber 222 to be in communication with a negative pressure and to allow the air chamber 226 to be in communication with a positive pressure. In this way, the regions of the substrate holder 150 that face the air chambers 222 and 226 are individually deformed (step S204).

Since the attraction of the substrate 121 by the electrostatic chuck 158 of the substrate holder 150 is deactivated, the substrate 121 is kept flat without being deformed on the substrate holder 150. Accordingly, the substrate 121 is partially spaced away from the substrate holder 150 without being supported.

Figure 27:
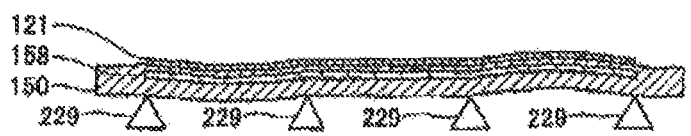
FIG. 27 is a cross-sectional view illustrating the transition of the states of the substrate 121 and the substrate holder 150.

Subsequently, the controller 112 applies a voltage to the electrostatic chuck 158 of the substrate holder 150 to attract the substrate 121 (step S205). In this way, the substrate 121 is deformed following the deformed shape of the substrate holder 150, as shown in FIG. 27. Therefore, the lower surface of the substrate 121 is in close contact with the placement surface 156 of the substrate holder 150.

Figure 28:
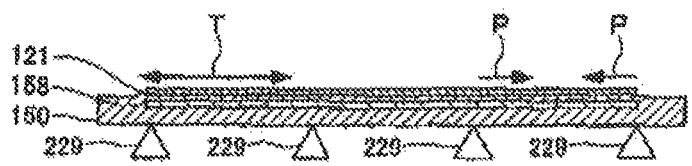
FIG. 28 is a cross-sectional view illustrating the transition of the states of the substrate 121 and the substrate holder 150.

After this, the controller 112 controls the valves 221 and 225 to allow the air chambers 222 and 226 in which the pressure has been respectively reduced and increased to be in communication with the atmospheric pressure while keeping the electrostatic chuck 158 of the substrate holder 150 activated. Therefore, the deformation of the substrate holder 150 is undone, and a restoring force is generated due to the elasticity of the substrate holder 150 to "inversely deform" the substrate holder 150 in a given direction to regain its flat state as shown in FIG. 28 (step S206).

The substrate holder 150, which is significantly thicker than the substrate 121, has higher bending rigidity than the substrate 121. Furthermore, the entire lower surface of the substrate 121 is in contact with the placement surface 156 of the substrate holder 150. The deformation caused by the restoring force of the substrate holder 150 bends the substrate 121. Therefore, as shown in FIG. 28 by the arrows T and P, stress to horizontally expand or shrink the substrate 121 in the plane direction of the substrate 121 acts on the substrate 121. This partially changes the magnification ratios for forming the device regions 126.

Note that the substrate holder 150 is inversely deformed together with the substrate 121 while attracting the substrate 121 by causing the electrostatic chuck 158 to keep attracting the substrate 121. Therefore, the restoring force caused by the inversely deforming substrate holder 150 is affected by the sum of the bending rigidity of the substrate holder 150 and the bending rigidity of the substrate 121.

Subsequently, while maintaining the corrected substrate 121 by using the electrostatic chuck 158, the controller 112 allows alignment to be performed between the corrected substrate 121 and the substrate 121 secured on the fixed stage 250 (step S207). In the above-described manner, the aligner 170 can achieve higher alignment accuracy than before the substrate 121 is corrected. Here, the controller 112 stores therein and refers to a table in which the amount of the driving of the actuator provided by the holder 220 is associated with the amount of the correction of the misalignment between the substrates 121, similarly to the case of the bender 180.

When the substrate 121 is attracted again in the step S205, the voltage applied to the electrostatic chuck 158 is preferably set higher in the partial regions in which there is a large gap between the substrate 121 and the substrate holder 150 than in the other partial regions, as previously described. Therefore, the electrodes constituting the electrostatic chuck 158 may be divided in accordance with the arrangement of the air chambers 222, 224 and 226.

As discussed above, the holder 220 can partially corrects the magnification ratios for the device regions 126 of the substrate 121 held by the substrate holder 150 by separately deforming the individual partial regions of the substrate holder 150. Thus, target alignment accuracy can be accomplished for the substrates 121 that cannot be aligned to each other by simply moving the fine-motion stage 230.

During the above-described series of operations, the controller 112 allows the vacuum chuck 229 to keep attracting the substrate holder 150. Therefore, there is no chance of the substrate holder 150 falling from the fine-motion stage 230 during the series of operations. In addition, even if the partial regions of the substrate 121 are corrected in terms of the magnification ratios, the other partial regions can remain unaffected.

In the above-described example, the bender 180 that is configured to collectively change the magnification ratios of the device regions 126 in the entire substrate 121 is provided outside the aligner 170, and the holder 220 that is configured to change the magnification ratios of the partial regions of the substrate 121 is provided in the fine-motion stage 230 of the aligner 170. However, the positions of the bender 180 and the holder 220 may be switched, and both may be provided outside the aligner 170. Alternatively, the bender 180 and the holder 220 may be provided outside the multilayered substrate manufacturing apparatus 100. Furthermore, one of the bender 180 and the holder 220 may be omitted.

When the electrostatic chuck 158 is deactivated in the steps S106 and S203, the substrate 121 and the substrate holder 150 may be displaced from the positions determined by the pre-aligner. To address this issue, when the corrected substrate 121 is transported to the aligner 170 in the step S110, and when the corrected substrate 121 is aligned by the aligner 170 in the step S207, the alignment may be calculated again using the alignment marks of the corrected substrate 121. If the result of this second calculation indicates that the amount of the shift within the X-Y plane and the amount of the rotation on the Z axis, which are caused by the displacement, can be corrected by the aligner 170, the displacement may be preferably compensated for by the aligner 170 during the alignment operation of the corrected substrate 121. If the result of the second calculation indicates that the amount of the shift within the X-Y plane and the amount of the rotation on the Z axis, which are caused by the displacement, cannot be compensated for by the aligner 170, the substrate 121 and the substrate holder 150 may be preferably returned to the pre-aligner 160 to perform the prealignment operation again.

Alternatively or additionally, immediately after the electrostatic chuck 158 is deactivated in the step S203, the microscope 251 of the aligner 170 and the like may be used to measure the displacement of the substrate 121 that may be possibly caused by the deactivation of the electrostatic chuck 158. Furthermore, the controller 112 may modify the solution that can accomplish the target alignment accuracy, in accordance with the displacement, and drive the actuator that is configured to correct the substrate 121, in accordance with the modified solution.

Referring to the method of bonding a pair of substrates 121 by correcting one of the substrates 121, a case may be considered where there is a difference in thickness between the substrates 121, in other words, one of the substrates 121 is a multilayered substrate 123, or both of them are multilayered substrates 123 but different in the number of the layers. In this case, a thicker one of the substrates 121 or multilayered substrates 123 is preferably held by the fixed stage 250 while a thinner one of the substrates 121 or multilayered substrates 123 is held and corrected by the fine-motion stage 230. In this way, the substrate 121 or multilayered substrate 123 which is easier to be deformed can be corrected for the bonding process.

Furthermore, the mechanism of the substrate holder 150 to hold the substrate 121 placed on the substrate holder 150 is not limited to the electrostatic chuck 158. Other methods including a vacuum chuck utilizing a negative pressure source connected to the multilayered substrate manufacturing apparatus 100 can be used.

The mechanism of the bender 180 and the holder 220 to deform the substrate holder 150 may be configured to apply a pressure using a fluid, or alternatively adapted to transmit to the substrate holder 150 displacement that is mechanically generated by a piezoelectric material or an actuator of any type. Alternatively, a plurality of types of actuators may be combined and used.

Figure 29:
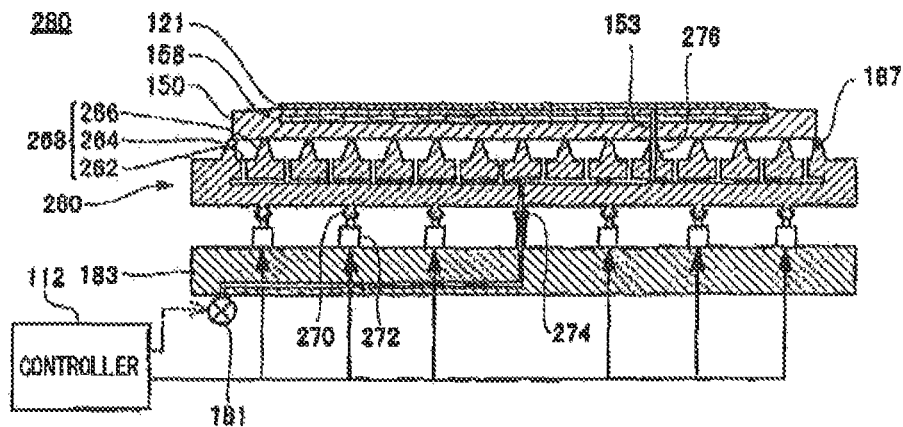
FIG. 29 is a schematic cross-sectional view of a bender 280.

FIG. 29 is a schematic cross-sectional view illustrating a bender 280 having a different configuration. The bender 280 includes a controller 112, a base plate 183 and a support plate 260. The base plate 183 is joined to the support plate 260 at a plurality of locations using a movable coupler 270, actuators 272 and a stationary coupler 274.

The actuators 272 individually expand and shrink to move up and down the movable coupler 270. The actuators 272 can be piezoelectric actuators, air actuators and the like that operate without generating heat. The stationary coupler 274 is directly coupled to the center of the base plate 183 and to the center of the support plate 260 to maintain a constant interval between the base plate 183 and the support plate 260.

The movable coupler 270 and the stationary coupler 274 can efficiently transmit to the support plate 260 the movement of the actuators 272 in the dilution in which the actuators 272 expand and shrink, or in the vertical direction. In this way, when one of the actuators 272 is operated, the corresponding portion of the support plate 260 is moved in the moving-up-and-down direction.

When a portion of the support plate 260 is moved in such a manner that the inclination of the support plate 260 changes with respect to the base plate 183, such a movement is not transmitted to the actuator 272 by the arc-like movement of the movable coupler 270 and the stationary coupler 274. Therefore, when the actuators 272 are operated and expand and shrink, the respective portions of the support plate 260 are moved only in the direction orthogonal to the base plate 183 and deformed.

The support plate 260 includes a pin chuck 268 having attraction holes 262, a frame portion 264 and support protrusions 266. The attraction holes 262 are many holes distributed on the upper surface of the support plate 260 across the inner space enclosed by the frame portion 264, and open between the support protrusions 266. The attraction holes 262 are individually connected to a negative pressure source through the stationary coupler 274, the base plate 183 and the valve 181.

The frame portion 264 of the support plate 260 is annular along the edge portion of the substrate holder 150, which is supported by the support plate 260. Therefore, when the valve 181 is opened while the substrate holder 150 is placed on the support plate 260, the pressure between the substrate holder 150 and the support plate 260 is reduced, so that the substrate holder 150 is attracted by the support plate 260.

The support protrusions 266 are arranged within the region surrounded by the frame portion 264 on the upper surface of the support plate 260. The top surfaces of the support protrusions 266 are at the same level as the highest portion of the frame portion 264. Therefore, the substrate holder 150 is flat when placed on the frame portion 264 and the support protrusions 266 while the support plate 260 is flat.

The controller 112 opens and closes the valve 181 and controls the operations of the individual actuators 272. Specifically speaking, the controller 112 opens or closes the valve 181 to attract or release the substrate holder 150 to or from the support plate 260. In addition, the controller 112 individually expands or shrinks the actuators 272 so that the support plate 260 can be partially moved up or down.

In addition, the substrate holder 150 has a through hole 153 that penetrates through the substrate holder 150 from the placement surface 156 thereof, on which the substrate 121 can be placed, to the surface facing the support plate 260. Furthermore, the support plate 260 has a negative pressure path 276 that is at one end thereof in communication with the through hole 153 and is at the other end thereof connected to a negative pressure source, which is shared with the attraction holes 262. Since the through hole 153 is connected to the negative pressure source via the negative pressure path 276, the pressure in the through hole 153 is controlled to be negative to vacuum the space between the substrate 121 and the substrate holder 150 in order to attract the substrate 121 to the substrate holder 150 in the bender 280.

The substrate holder 150 includes the electrostatic chuck 158 to attract the substrate 121, as described previously. When the substrate holder 150 keeping the substrate 121 attracted thereto is placed on the upper surface of the support plate 260, the controller 112 suspends power supply to the electrostatic chuck 158 of the substrate holder 150. Accordingly, the substrate 121 is merely placed on the substrate holder 150 without being attracted.

Subsequently, the controller 112 opens the valve 181 to establish communication with the negative pressure source, so that a negative pressure is established in the attraction holes 262. Thus, the substrate holder 150 is attracted to the flat support plate 260, so that the substrate holder 150 and the support plate 260 form a single piece.

Figure 30:
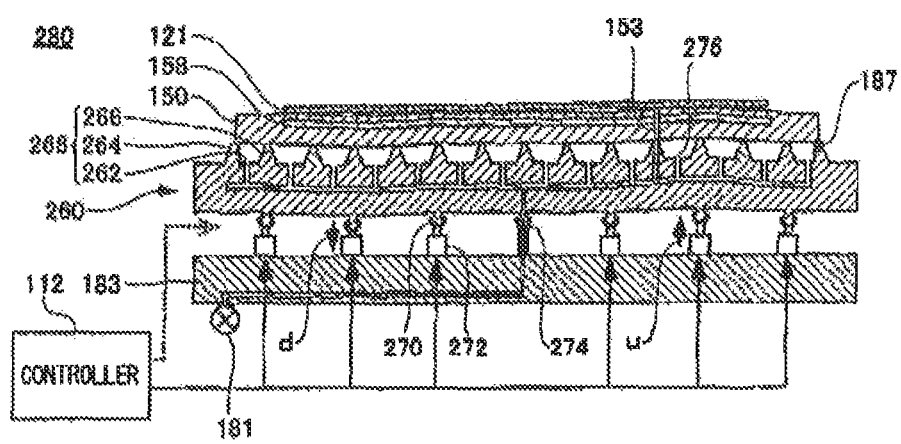
FIG. 30 is a schematic cross-sectional view of the bender 280.

FIG. 30 is a schematic cross-sectional view illustrating the bender 280, specifically speaking, illustrating that some of the actuators 272 are operated. The common constituents between FIGS. 29 and 30 are assigned with the same reference numerals and not described here.

As shown in FIG. 30 by the arrow d, the actuator 272 second from the left shrinks to move the movable coupler 270 down to partially move the support plate 260 down, in the shown in example. As shown in FIG. 30 by the arrow u, the actuator 272 second from the right expands to move the movable coupler 270 up to partially move the support plate 260 up. By partially moving the support plate 260 up and down as discussed above, the support plate 260 is deformed.

The support plate 260 attracts the substrate holder 150 using the negative pressure established in the attraction holes 262, so that the support plate 260 and the substrate holder 150 form a single piece. Therefore, if the support plate 260 is deformed as discussed above, the substrate holder 150 is also deformed following the deformation of the support plate 260.

At this stage, however, the electrostatic chuck 158 of the substrate holder 150 is not active, and the substrate holder 150 is not attracting the substrate 121 thereto. Accordingly, the substrate 121 placed on the deformed substrate holder 150 is merely placed on the upper surface of the substrate holder 150 without being attracted and may be partially spaced away from the upper surface of the substrate holder 150.

As discussed above, in one of the steps for correcting the substrate 121, the support plate 260 and the substrate holder 150 are deformed from an initial state to a more deformed state while the substrate 121 is not attracted to the substrate holder 150. The initial state of the substrate holder 150 is, for example, a flat state of the substrate holder 150. Here, the controller 112 stores therein and refers to a table in which the amount of the driving of the actuators 272 is associated with the amount of the correction of the misalignment between the substrates 121, similarly to the case of the bender 180.

Figure 31:
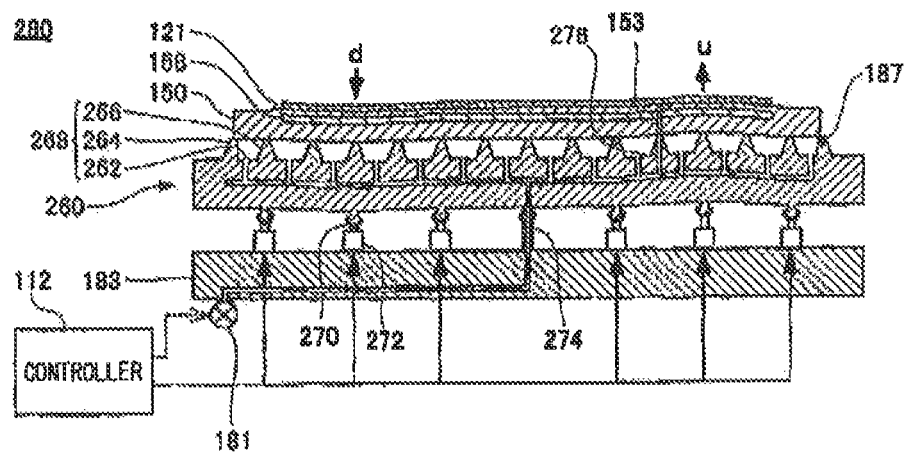
FIG. 31 is a schematic cross-sectional view of the bender 280.

FIG. 31 is a schematic cross-sectional view illustrating the bender 280, specifically speaking, illustrating the next state after the state shown in FIG. 30. The common constituents between FIGS. 29, 30 and 31 are assigned with the same reference numerals and not described here.

While the shown state is maintained, the controller 112 allows a voltage to be applied to the electrostatic chuck 158. Thus, the substrate 121 is attracted to the substrate holder 150, which has been deformed together with the support plate 260, so that the substrate 121, the substrate holder 150 and the support plate 260 form a single piece.

If the actuators 272 are operated while this state is maintained, the support plate 260 and the substrate holder 150 can be used to remove or reduce the deformation of the substrate 121. Specifically speaking, in the step shown in FIG. 30, the support plate 260 and the substrate holder 150, which form a single piece, are deformed following the deformation of the substrate 121 After this, the actuators 272 are operated while this state is maintained in a manner to return the deformed support plate 260 to the flat state. Accordingly, the substrate holder 150 and the substrate 121 become flat.

In another one of the steps for correcting the substrate 121, while the substrate 121 remains attracted, the support plate 260 is deformed so as to return the substrate holder 150 from the deformed state to the initial state. Thus, the support plate 260 is returned from the deformed state to the initial state after the substrate 121 is held. In this manner, the substrate 121 is corrected by its own deformation that follows the change of the substrate holder 150 from the deformed state to the initial state.

As discussed above, the support plate 260 can be used to correct various deformed states of the substrate 121 by deforming the substrate holder 150 that has the substrate 121 attracted thereto and held. The above-described support plate 260 can be used in the pre-aligner 160, the aligner 170 and the like, as part of a member that is configured to have the substrate 121 or the substrate holder 150 placed thereon.

In the above-described example, the support plate 260 attracts and supports the substrate holder 150, and deforms the substrate 121 as well as the substrate holder 150. The support plate 260, however, can alternatively directly attract and supports the substrate 121 to deform the substrate 121. As a result, the support plate 260 can be used even when the substrate holder 150 is not used.

As described above, the bender 280 may be used to partially deform the partial regions of the substrate 121 by applying forces to the partial regions separately. Thus, to name a few, the bender 280 cart partially change the magnification ratios on the substrate 121 and partially correct the deformed substrate 121. Accordingly, for example, the substrate 121 can be flattened by deforming the substrate holder 150 in the same manner as the deformation of the substrate 121 to be treated, allowing the substrate holder 150 to attract the substrate 121 thereto, and then undoing the deformed state of the substrate holder 150.

In the above-described example, the actuators 272 are used to return the support plate 260 from the deformed state to the flat state in order to return the substrate 121 to the flat state. However, the same effects may be produced by deactivating the pin chuck 268 to release the substrate holder 150. In other words, while the substrate 121, the substrate holder 150 and the support plate 260 are forming a single piece in the step shown in FIG. 31, deactivation of the pin chuck 268 to stop attracting the substrate holder 150 allows the substrate holder 150 to be "inversely deformed" due to its own elasticity and thus to substantially regain the initial flat state.

Here, the substrate holder 150, which is significantly thicker than the substrate 121, has higher bending rigidity than the substrate 121. Furthermore, the entire lower surface of the substrate 121 is attracted the placement surface 156 of the substrate holder 150. Therefore, if the substrate holder 150 is inversely deformed, the substrate 121 is also deformed following the inverse deformation of the substrate holder 150.

If such is the case, in the step in which the deformation of the substrate holder 150 is undone, the electrostatic chuck 158 keeps attracting the substrate 121, so that the substrate holder 150 is inversely deformed while keeping attracting the substrate 121 thereto. The restoring force caused by the inversely deforming substrate holder 150 is affected by the sum of the bending rigidity of the substrate holder 150 and the bending rigidity of the substrate 121. Therefore, the beading rigidity of the support plate 260 is higher than the bending rigidity of the substrate 121 and the bending rigidity of the substrate holder 150, and preferably has higher bending rigidity than the sum of the bending rigidity of the substrate 121 and the betiding rigidity of the substrate holder 150.

Thus, the substrate holder 150 does not regain the flat state as before the deformation simply by undoing the deformation of the substrate holder 150 that is caused by the support plate 260. However, the substrate holder 150 continuously applies, to the substrate 121, a force to return the substrate 121 from the deformed state to the flat state. Therefore, the force necessary to return the substrate 121 from the deformed state to the flat state can be reduced.

If the substrate holder 150 does not return to the flat state even after the pin chuck 268 is deactivated to stop holding the substrate holder 150, the actuators 272 may be used to deform the substrate holder 150 again in order to force the substrate holder 150 to regain the flat state. Alternatively to the above-mentioned technique, the amount of the deformation of the substrate holder 150 may be changed so that the amount of the correction of the substrate 121 can achieve desired alignment accuracy while the substrate holder 150 is not flat.

As discussed above, the bender 280 includes the support plate 260 that is configured to hold the substrate 121, which is to be bonded to another substrate 121, together with the substrate holder 150, and the actuators 272 that are configured to correct misalignment between the held substrate 121 and the other substrate 121 by deforming the support plate 260 in the direction intersecting the plane direction of the held substrate 121 to allow the held substrate 121 to be deformed.

The number of the actuators 272 is preferably determined as follows. Since the center of the support plate 260 is coupled using the stationary coupler 274, at least two actuators are preferable if the substrate 121 is corrected one-dimensionally, four actuators in total are preferable to correct the substrate 121 two-dimensionally, and six actuators in total are preferable to correct the substrate 121 three-dimensionally. When the substrate 121 is corrected two-dimensionally, the number of the actuators 272 is preferably equal to a square of the number of the actuators 272 used for the one-dimensional correction. In particular, when the actuators 272 are arranged in a square lattice, four actuators are preferably provided for one-dimensional correction, sixteen actuators are preferably provided for two-dimensional correction, and thirty-six actuators are preferably provided for three-dimensional correction.

Thus, a correction step can be performed in which misalignment between the held substrate 121 and another substrate 121 to be bonded is corrected by deforming the held substrate 121 in the direction intersecting the plane direction as discussed above. In other words, when a pair of substrates 121 are subjected to an alignment operation, there may be misalignment equal to or larger than a threshold value after the alignment operation. In this case, the bender 280 described above can be used to deform the support plate 260, the substrate holder 150 and the substrate 121 to remove the remaining misalignment.

Figure 32:
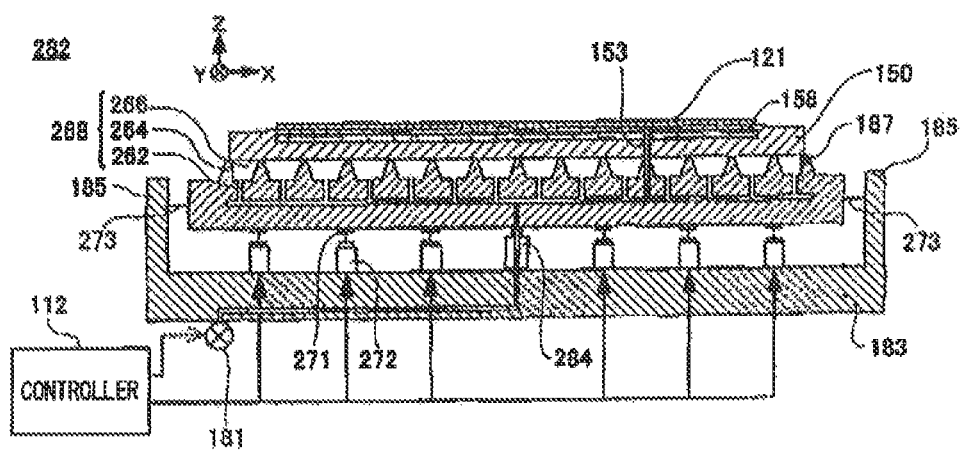
FIG. 32 is a cross-sectional view of another bender 282.
Figure 33:
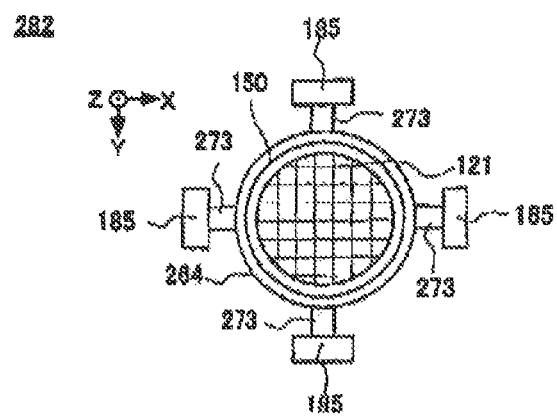
FIG. 33 is an upper view of the bender 282.

FIG. 32 is a cross-sectional view illustrating another bender 282, and FIG. 33 is a top view of the bender 282. The common constituents between the benders 282 and 280 are assigned with the same reference numerals and not described here.

The bender 282 includes four walls 185 surrounding the base plate 183. Between the four walls 185 and the support plate 260, flat springs 273 span. The plane direction of the flat springs 273 coincides with the XY plane. Thus, the flat springs 273 allows their coupling portions coupled to the support plate 260 to move in the Z direction but prevents their coupling portions from moving in the XY direction and from rotating on the Z axis.

Figure 34:
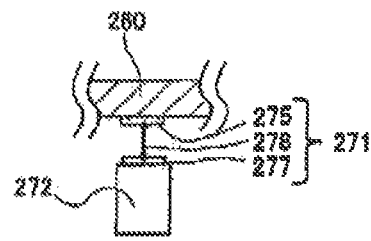
FIG. 34 is an enlarged view of a movable coupler 271 of the bender 282.

FIG. 34 is an enlarged view of a movable coupler 271 employed in the bender 282. The movable coupler 271 includes a plate-like member 275 secured onto the lower surface of the support plate 260, a plate-like member 277 secured onto the upper surface of the actuator 272 to face the plate-like member 275, and an elastic member 278 coupled between the pair of plate-like members 275 and 277. The elastic member 278 is, for example, a columnar elastic member, and configured to transmit a driving force in the driven direction of the actuator 272 and to elastically deform in the direction orthogonal to the driver direction. Thus, the elastic member 278 can remove the deformation of the support plate 260 caused by the movement of the support plate 260 in the XY direction, which result from the movement of the actuator 272 in the Z direction.

Figure 35:
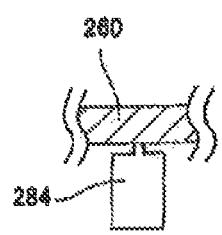
FIG. 35 is an enlarged view of a stationary coupler 284 of the bender 282.

FIG. 35 is an enlarged view of a stationary coupler 284 employed in the bender 282. The stationary coupler 284 includes a large-diameter body portion and a small-diameter portion arranged on the upper surface of the body portion. The small-diameter portion has a height of approximately 0.2 mm to 0.5 mm. The stationary coupler 284 is coupled to the lower surface of the support plate 260 at the small-diameter portion thereof.

Since the stationary coupler 284 is coupled to the support plate 260 at the small-diameter portion thereof, a large region of the support plate 260 can be deformed. On the other hand, the large-diameter body portion can strongly support the support plate 260 against a twisting force exerted by the support plate 260 and other forces.

Here, note that the bender 282 has the flat springs 273. Accordingly, the support plate 260 can be allowed to be deformed in the Z direction but prevented from wobbling in the XY direction or rotating on the Z axis even though the movable couplers 271 are capable of moving the support plate 260 in the XY direction.

Figure 36:
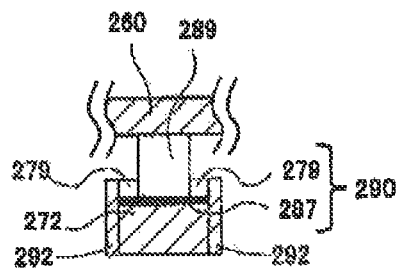
FIG. 36 is an enlarged view of another movable coupler 290.

FIG. 36 is an enlarged view of another movable coupler 290. The movable coupler 290 includes a coupler 289 that is coupled at the upper end thereof to the support plate 260, a defining wall 292 that extends upwards from the actuator 272, and a slide surface 287 with which the other end of the coupler 289 is in contact. The coupler 289 is capable of sliding within a movable region 279 defined by the defining wall 292.

Between the defining wall 292 and the coupler 289, a movable region is formed in which the coupler 289 can move in the XY direction. As the actuator 272 moves in the Z direction, the support plate 260 resultantly moves in the XY direction. This may cause deformation of the support plate 260, which can be removed by allowing the other end of the coupler 289 to slide on the sliding surface 287 within the movable region.

Figure 37:
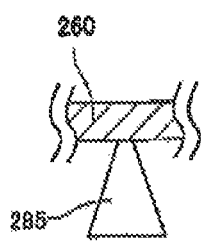
FIG. 37 is an enlarged view of another stationary coupler 285.

FIG. 37 is an enlarged view of another stationary coupler 285. The stationary coupler 285 has a cone-like shape such that the diameter of the stationary coupler 285 gradually decreases from the base plate 183 to the support plate 260. Thus, the stationary coupler 285 can produce the same effects as the stationary coupler 284 shown in FIG. 35.

Figure 38:
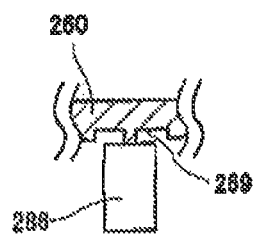
FIG. 38 is an enlarged view of yet another stationary coupler 286.

FIG. 38 is an enlarged view of yet another stationary coupler 286. The stationary coupler 286 has a column-like shape having a large diameter. On a portion of the support plate 260 that is coupled to the stationary coupler 286, a depression 269 is provided as a clearance for the stationary coupler 286. At the center of the depression 269, a protrusion is provided that is coupled to the stationary coupler 286 and has a smaller diameter than the stationary coupler 286. Thus, the stationary coupler 286 can produce the same effects as the stationary coupler 284 shown in FIG. 35.

The support plate 260 may have a curved portion that is curved with a predetermined curvature. In this case, the actuators 272 deform the support plate 260 in such a manner that the curvature of the support plate 260 is varied. The mechanism of the bender 280 that is configured to separately deform the respective regions by means of a plurality of actuators 272 may be also provided in the substrate holder 150. In this way, existing facility can be used to correct the substrate 121.

Figure 39:
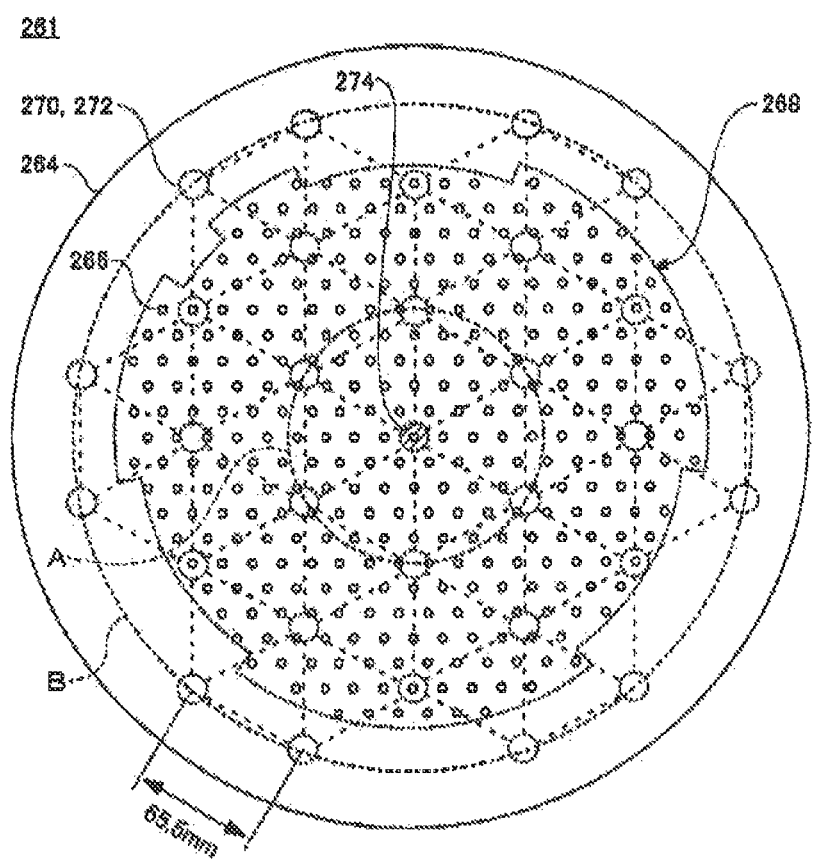
FIG. 39 is a plan view of a support plate 261.

FIG. 39 is a plan view illustrating how the movable couplers 270 and the stationary coupler 274 are arranged, for example, for the support plate 261 of the bender 280. On the surface of the support plate 261, the large number of support protrusions 266 are arranged within the frame portion 264. Between the support protrusions 266, the large number of minute attraction holes 262 are arranged, which are not visible with the scale of FIG. 39. Therefore, when placed on the support plate 261, the entire substrate holder 150 can be subjected to uniform attracting force.

The stationary coupler 274 is positioned at the center of the support plate 261. As described above, the stationary coupler 274 is fixed to the base plate 183 and also to the support plate 261. Thus, the center of the support plate 261 is fixed to the base plate 183 in the plane direction and also in the direction orthogonal to the plane direction.

The movable couplers 270 are arranged, starting from the stationary coupler 274, two-dimensionally in such a manner that even intervals are provided between any adjacent movable couplers 270. In the shown example, the movable couplers 270 are arranged on the vertices of equilateral triangles that cover the surface of the support plate 261 in a tessellation format. In other words, the movable couplers 270 are arranged on the vertices and centers of equilateral hexagons that cover the surface of the support plate 261 in a tessellation format and form a honeycomb structure.

In this way, when moved up and down by the actuators 272, the movable couplers 270 can separately move up and down the respective regions of the support plate 261. Thus, the respective regions of the substrate holder 150 that is attracted to the support plate 261 can be also separately deformed. Furthermore, the outer edge portion of the substrate holder 150 can be also deformed by providing some movable couplers 270 outside the substrate holding region of the substrate holder 150, which is placed on the support plate 261.

The movable couplers 270 arranged on the inner circle A on the support plate 260 are arranged at even intervals along the entire circumference. On the other hand, larger gaps are periodically provided between the movable couplers 270 and actuators 272 arranged on the outer circle B. When the movable couplers 270 are arranged in the above-described manner, however, the controllability of the support plate 260 is hardly degraded during the procedure of deforming the substrate holder 150 and the substrate 121.

Specifically speaking, as shown in FIG. 39, a support plate 260 was manufactured in which one stationary coupler 274 and thirty movable couplers 270 were arranged in such a manner that the distance between any adjacent movable couplers 270 was 65.5 mm. This support plate 260 was used to attempt to correct as substrate 121 having a diameter of 300 mm. In this case, the positions of the alignment marks could be corrected with high accuracy as shown in Table 1 below

TABLE 1

|  | X(µm) | Y(µm) |
|---|---|---|
| MAXIMUM | 0.065 | 0.039 |
| MINIMUM | −0.065 | −0.037 |
| 3σ | 0.037 | 0.033 |

Figure 40:
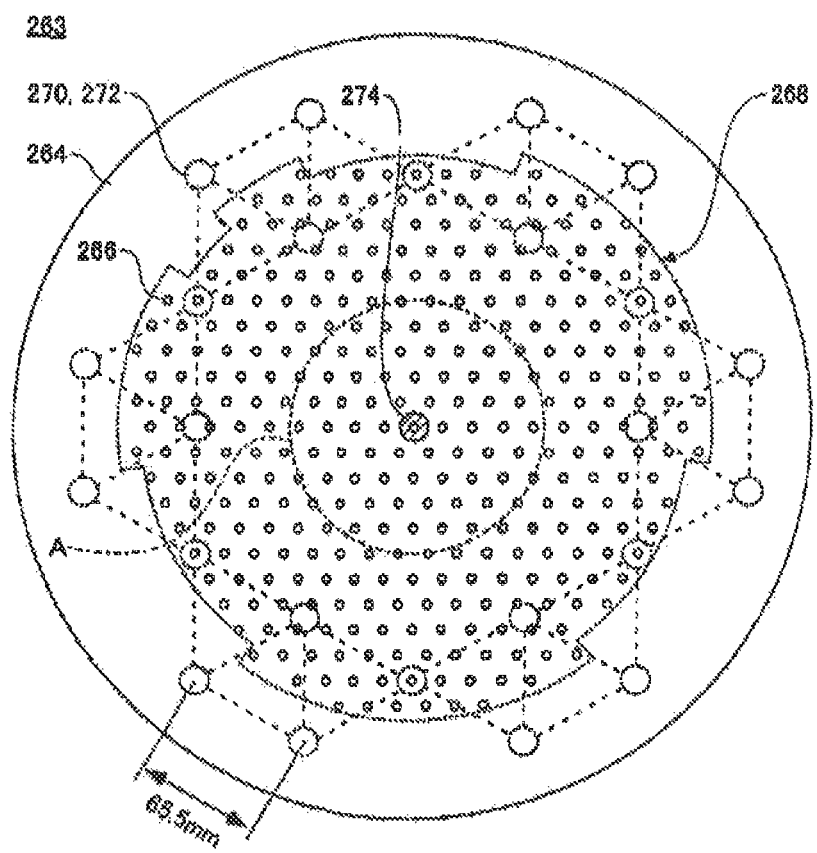
FIG. 40 is a plan view of a support plate 263.

FIG. 40 is a plan view illustrating how movable couplers 270 are arranged in another support plate 263 of the bender 280. The movable couplers 270 provided on the shown support plate 263 are arranged at the same positions as some of the movable couplers 270 provided on the support plate 261 shown in FIG. 39. The movable couplers 270 arranged on the inner circle A on the support plate 261 are omitted. The attracting holes 262, the support protrusions 266 and the stationary coupler 274 are arranged in the same manner as on the support plate 261 shown in FIG. 39.

The above-described arrangement of the movable couplers 270 hardly degraded the controllability during the deformation of the substrate holder 150 and the substrate 121. Specifically speaking, the support plate 263 was manufactured in the same manner as the support plate 261 shown in FIG. 39 except for that the six movable couplers 270 on the inner circle were omitted, and used to attempt to correct a substrate 121 having a diameter of 300 mm. As shown in Table 2 below, the accuracy only slightly dropped,

TABLE 2

|  | X(µm) | Y(µm) |
|---|---|---|
| MAXIMUM | 0.071 | 0.045 |
| MINIMUM | −0.070 | −0.044 |
| 3σ | 0.040 | 0.036 |

Figure 41:
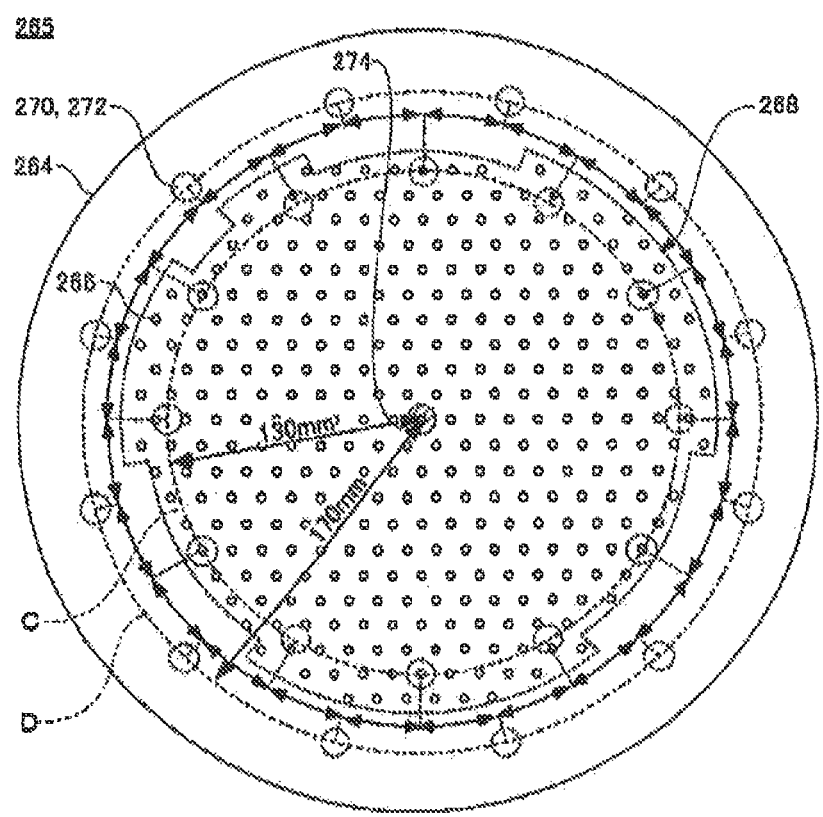
FIG. 41 is a plan view of a support plate 265.

FIG. 41 is a plan view illustrating how movable couplers 270 are arranged on a support plate 265 of the bender 280. The support plate 265 includes the same number of movable couplers 270 as the support plate 263 shown in FIG. 40. The attraction holes 262, the support protrusions 266 and the stationary coupler 274 are arranged in the same manner as in the support plates 261 and 263 shown in FIG. 32.

On the support plate 265, however, half the movable couplers 270 are arranged at even intervals on a circle D having a larger diameter than the outer diameter of the substrate 121, so as to be positioned outside the substrate 121 placed on the support plate 265. The remaining half of the movable couplers 270 are arranged at even intervals on a circle C having a smaller diameter than the outer diameter of the substrate 121, so as to be positioned inside the substrate 121 place on the support plate 265. Here, the circles C and D are concentrically arranged.

Furthermore, the arrangement of the movable couplers 270 positioned outside the substrate 121 is out of alignment, by half the pitch of the movable couplers 270, relative to the arrangement of the movable couplers 270 positioned inside the substrate 121. Therefore, when seen in the radial direction of the substrate 121, the distance between any adjacent movable couplers 270 is equal. When the movable couplers 270 are arranged in the above-described manner, high controllability is achieved for deformation of the substrate holder 150 and the substrate 121 even using a relatively small number of movable couplers 270.

Specifically speaking, the support plate 265 as shown in FIG. 41 was manufactured on which twelve movable couplers 270 were arranged at even intervals on each of the circle B having a radius of 130 mm and the circle C having a radius of 170 mm. The support plate 265 was used to attempt to correct a substrate 121 having a diameter of 300 mm. The substrate 121 could be corrected with high accuracy as shown in Table 3 below.

TABLE 3

|  | X(μm) | Y(μm) |
| --- | --- | --- |
| MAXIMUM | 0.040 | 0.039 |
| MINIMUM | −0.039 | −0.039 |
| 3σ | 0.027 | 0.027 |

The above-mentioned results proved that the accuracy of the correction did not drop even with a reduced number of movable couplers 270 being two-dimensionally arranged on the outmost and inmost circles. This indicates that the substrate 121 could be corrected with high accuracy using the low-cost support plate 265 with a reduced number of actuators 272 being arranged.

Figure 42:
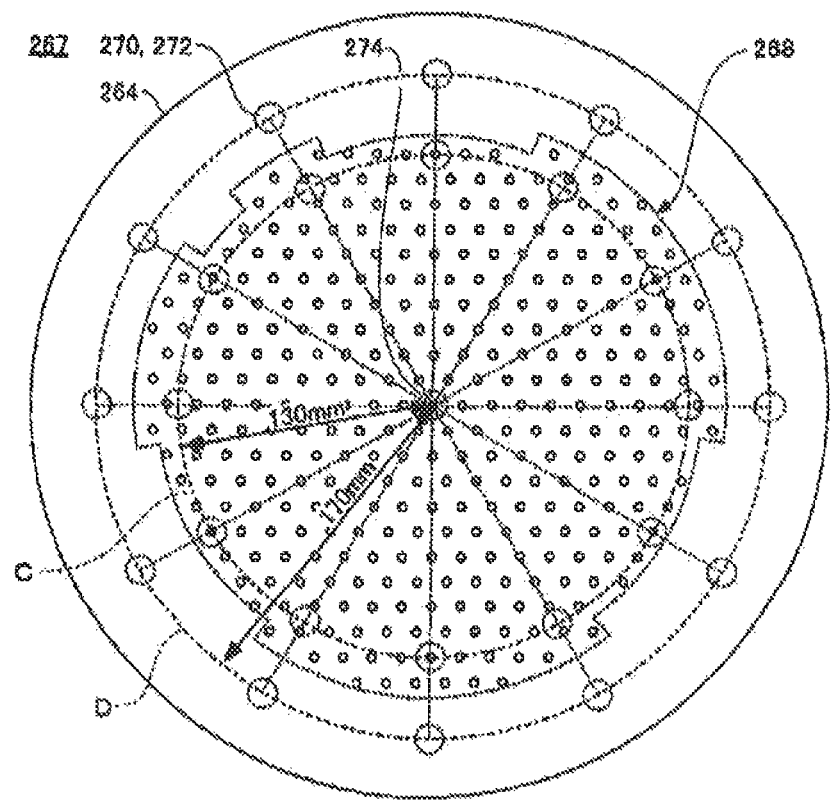
FIG. 42 is a plan view of a support plate 267.

FIG. 42 is a plan view illustrating how movable couplers 270 are arranged on a support plate 267 of the bender 280. The support plate 267 includes the same number of movable couplers 270 as the support plate 265 shown in FIG. 41.

On the support plate 267, similarly to the support plate 265, half the movable couplers 270 are arranged at even intervals on a circle D having a larger diameter than the outer diameter of the substrate 121, so as to be positioned outside the substrate 121 placed on the support plate 265. The remaining half of the movable couplers 270 are arranged at even intervals on a circle C having a smaller diameter than the outer diameter of the substrate 121, so as to be positioned inside the substrate 121 placed on the support plate 265.

In addition, the arrangement of the movable couplers 270 on the circle C is aligned with the arrangement of the movable couplers 270 on the circle D. Therefore, the movable couplers 270 arranged on the circle C are arranged at the same positions, when seen in the radial direction, as the movable couplers 270 on the circle D. Having such a support plate 267, the bender 280 could correct the substrate 121 with higher accuracy as shown in Table 4 below.

TABLE 4

|  | X(μm) | Y(μm) |
| --- | --- | --- |
| MAXIMUM | 0.035 | 0.035 |
| MINIMUM | −0.035 | −0.034 |
| 3σ | 0.027 | 0.027 |

Note that the arrangement of the movable couplers 270, which are designed to deform the support plate 267 of the bender 280, is not limited to the above-described examples. For example, when the movable couplers are arranged on a plurality of concentrical circles, the concentrical circles may be all positioned inside or outside the substrate 121. In addition, the number of the movable couplers 270 may be increased or decreased.

Figure 43:
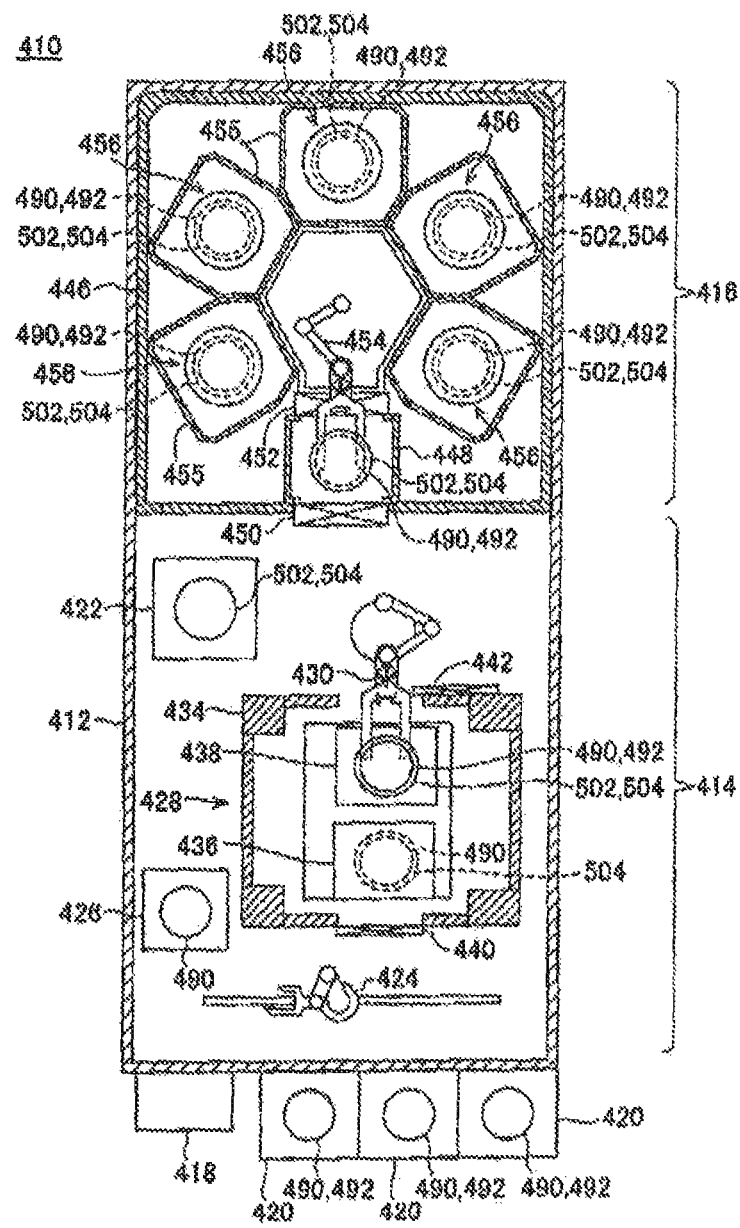
FIG. 43 shows the overall structure of a substrate bonding apparatus 410.

FIG. 43 illustrates an overall configuration of a substrate bonding apparatus. A substrate bonding apparatus 410 is designed to manufacture a multilayered substrate 492 by bonding two substrates 490 to each other. The substrate bonding apparatus 410 may be alternatively designed to manufacture a multilayered substrate 492 by bonding three or more substrates 490 to each other.

As shown in FIG. 43, the substrate bonding apparatus 410 includes a housing 412, an ordinary-temperature portion 414, a high-temperature portion 416 and a controller 418. The housing 412 surrounds the ordinary-temperature portion 414 and the high-temperature portion 416.

The ordinary-temperature portion 414 includes a plurality of substrate cassettes 420, a substrate holder rack 422, a robot arm 424, a pre-aligner 426, an aligner 428, and a robot arm 430. The robot arms 424 and 430 are an example of a transporter.

The substrate cassettes 420 are designed to house therein substrates 490 to be joined and bonded to each other in the substrate bonding apparatus 410. The substrate cassettes 420 are also designed to house therein multilayered substrates 492 that have been manufactured by joining and bonding the substrates 490 in the substrate bonding apparatus 410. The substrate cassettes 420 are detachably attached to the outer surface of the housing 412. In this way, a plurality of substrates 490 can be collectively loaded into the substrate bonding apparatus 410. Furthermore, a plurality of multilayered substrates 492 can be collectively collected. The substrate 490 to be subjected to the bonding procedure in the substrate bonding apparatus 410 is a silicon wafer, a compound semiconductor wafer, a glass substrate or the like and may have elements, circuits, terminals and the like formed thereon. Furthermore, the substrate 490 may be a multilayered substrate 492 that has been manufactured by stacking a plurality of wafers.

The substrate holder rack 422 houses therein lower substrate holders 5 and upper substrate holders 504 that are designed to hold from above and below a pair of substrates 490 stacked to be formed into a multilayered substrate 492.

The robot arm 424 is positioned within the housing 412 and in the vicinity of the substrate cassettes 420. The robot arm 424 transports the substrates 490 loaded on the substrate cassettes 420 to the pre-aligner 426. The robot arm 424 transports the substrates 490 from the pre-aligner 426 further to the lower substrate holder 502 and the upper substrate holder 504 placed on a movable stage 438 of the aligner 428, which is described later. The robot arm 424 transports the multilayered substrates 492 that have been manufactured through the bonding procedure from the movable stage 438 to one of the substrate cassettes 420.

The pre-aligner 426 is positioned within the housing 412 and in the vicinity of the robot arm 424. The pre-aligner 426 is designed to roughly align the positions of the substrates 490 before the substrates 490 are loaded into the aligner 428 so that the substrates 490 can be loaded within a limited adjustable range. The aligner 428 has such a limited adjustable range due to its high accuracy. Thus, the aligner 428 can quickly and accurately align the substrates 490.

The aligner 428 is positioned between the robot arm 424 and the robot arm 430. The aligner 428 includes a frame member 434, a stationary stage 436, a movable stage 438, and a pair of shutters 440 and 442.

The frame member 434 surrounds the stationary stage 436 and the movable stage 438. The side of the frame member 434 facing the substrate cassettes 420 and the side of the frame member 434 facing the high-temperature portion 416 both have openings to allow the substrates 490 and the like to be loaded into and out of the frame member 434.

The stationary stage 436 is positioned within the frame member 434 and secured in the vicinity of the substrate cassettes 420. The lower surface of the stationary stage 436 is designed to attract, through vacuum, the upper substrate holder 504, which is transported from the movable stage 438 by the robot arm 430 while the upper substrate holder 504 is holding a substrate 490.

The movable stage 438 is positioned within the frame member 434 and closer to the high-temperature portion 416 than the stationary stage 436 is. The upper surface of the movable stage 438 is designed to attract, through vacuum, the lower substrate holder 502 and the upper substrate holder 504. The movable stage 438 moves in the horizontal and vertical directions within the frame member 434. In this way, as the movable stage 438 moves, the substrate 490 held on the stationary stage 436 by means of the upper substrate holder 504 is aligned with and stacked onto the substrate 490 held on the movable stage 438 by means of the lower substrate holder 502. The substrates 490 may be provisionally bonded to each other using an adhesive, a plasma or the like.

The shutter 440 opens and closes the opening on the side of the frame member 434 facing the substrate cassettes 420. The shutter 442 opens and closes the opening on the side of the frame member 434 facing the high-temperature portion 416. The space enclosed by the frame member 434 and the shutters 440 and 442 is in communication with an air conditioner or the like so that the temperature is controlled. Thus, the substrates 490 are aligned with improved accuracy.

The robot arm 430 is positioned within the housing 412 and between the high-temperature portion 416 and the aligner 428. The robot arm 430 transports the lower substrate holders 502 and the upper substrate holders 504 housed within the substrate holder rack 422 to the movable stage 438. When placed on the movable stage 438, the lower substrate holder 502 and the upper substrate holder 504 electrostatically attract and hold the substrate 490 transported by the robot arm 424 from the pre-aligner 426. The robot arm 430 turns over the upper substrate holder 504 that is placed on the movable stage 438 and is holding the substrate 490, and then transports the turned-over upper substrate holder 504 to the stationary stage 436. The lower surface of the stationary stage 436 attracts, through vacuum, the upper substrate holder 504 transported by the robot arm 430.

The robot arm 430 attracts, through vacuum, the lower substrate holder 502 and the upper substrate holder 504 that are holding the pair of substrates 490 that have been aligned by the movable stage 438, and transports the lower and upper substrate holders 502 and 504 to the high-temperature portion 416. The robot arm 430 transports the multilayered substrate 492 that has been manufactured by joining and bonding the substrates 490 in the high-temperature portion 416 from the high-temperature portion 416 to the movable stage 438.

The high-temperature portion 416 is controlled to have a high temperature and to achieve vacuum during the bonding step performed by the substrate bonding apparatus 410. The high-temperature portion 416 has a heat insulating wall 446, an air lock chamber 448, a pair of shutters 450 and 452, a robot arm 454, five housing chambers 455, and five heating and pressing apparatuses 456. The robot arm 454 is an example of a transporter. Here, the number of the heating and pressing apparatuses 456 is not limited to five and may be changed as appropriate.

The heat insulating wall 446 surrounds the high-temperature portion 416. Thus, the heat insulating wall 446 keeps a high temperature inside the high-temperature portion 416 and prevents the heat from being radiated from the high-temperature portion 416 to outside. As a result, the heat insulating wall 446 reduces the influence of the heat of the high-temperature portion 416 on the ordinary-temperature portion 414. Additionally, the heat insulating wall 446 blocks gases from flowing between the high-temperature portion 416 and outside. In this manner, the heat insulating wall 446 maintains the vacuum within the high-temperature portion 416.

The air lock chamber 448 allows the ordinary-temperature portion 414 to be in communication with the high-temperature portion 416. The side of the air lock chamber 448 that faces the ordinary-temperature portion 414 and the side of the air lock chamber 448 that faces the high temperature portion 416 each have an opening to transport a multilayered substrate 492 that is manufactured from a pair of substrates 490 held between the lower substrate holder 502 and the upper substrate holder 504.

The shutter 450 opens and closes the opening on the side of the air lock chamber 448 that faces the ordinary-temperature portion 414. When the shutter 450 is open, the air lock chamber 448 is in communication with the ordinary-temperature portion 414. Thus, the air lock chamber 448 has substantially the same air pressure as the ordinary-temperature portion 414. While this state is maintained, the robot arm 430 transports the multilayered substrate 492 between the air lock chamber 448 and the aligner 428.

The shutter 452 opens and closes the opening on the side of the air lock chamber 448 that faces the high-temperature portion 416. When the shutter 452 is open, the air lock chamber 448 is in communication with the high-temperature portion 416. Thus, the air lock chamber 448 has substantially the same air pressure as the high-temperature portion 416. Note that the shutters 450 and 452 are not open at the same time during the bonding step.

While the shutter 452 is open, the robot arm 454 loads the multilayered substrate 492, which has been transported into the air lock chamber 448 by the robot arm 430, into one of the heating and pressing apparatuses 456, together with the lower substrate holder 502 and the upper substrate holder 504.

The housing chambers 455 are hollow. Each housing chamber 455 houses therein and surrounds the main components of the corresponding one of the heating and pressing apparatuses 456. The housing chambers 455 have openable and closable openings to load the multilayered substrates 492. The housing chambers 455 are tightly sealed to achieve vacuum after having loaded the multilayered substrates 492 therein.

The heating and pressing apparatuses 456 are an example of a heating apparatus. The heating and pressing apparatuses 456 are positioned within the heat insulating wall 446. The five heating and pressing apparatuses 456 are arranged at substantially even angles with respect to the center of the space enclosed by the heat insulating wall 446. The heating and pressing apparatuses 456 hold therein the multilayered substrates 492 transported from the air lock chamber 448 by the robot arm 454. The heating and pressing apparatuses 456 are designed to pressure the multilayered substrates 492 at a joining temperature. The heating and pressing apparatuses 456 raise the temperature of the loaded multilayered substrates 492 to a joining temperature at which the substrates 490 constituting the multilayered substrates 492 can be joined to each other. In this manner, the heating and pressing apparatuses 456 join and bond the substrates 490 to obtain the multilayered substrates 492.

The robot arm 454 transports the multilayered substrates 492 that have been manufactured through the joining and bonding procedure from the heating and pressing apparatuses 456 to the air lock chamber 448.

The controller 418 controls the operations of the entire substrate bonding apparatus 410. The controller 418 includes a manipulator that is designed to be manipulated by a user from outside to power on the substrate bonding apparatus 410, to determine various settings and to perform other functions. Furthermore, the controller 418 includes a connector that is designed to connect the substrate bonding apparatus 410 to other devices.

Figure 44:
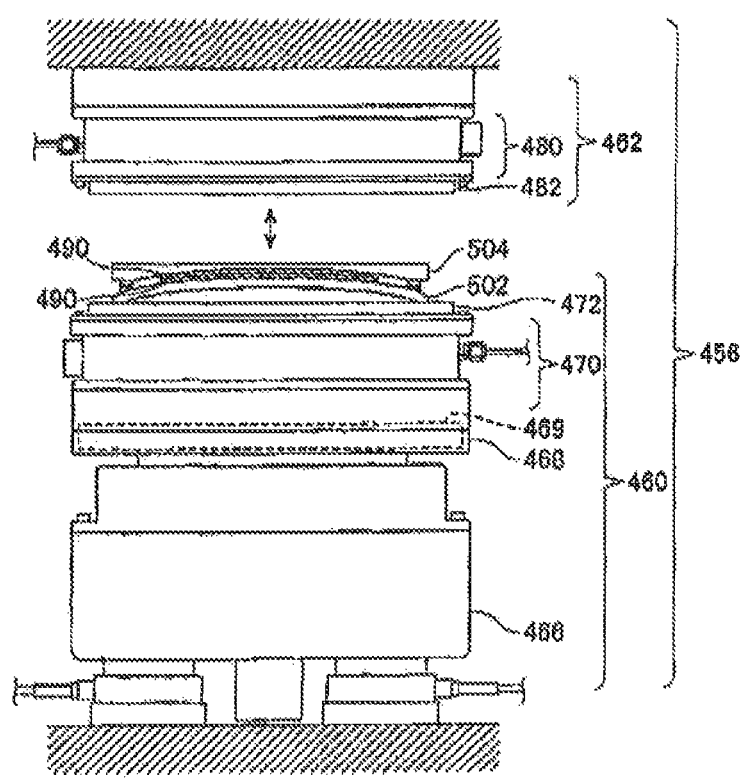
FIG. 44 is a front view illustrating the overall structure of a heating and pressing apparatus 456.

FIG. 44 is a front view showing the entire structure of each heating and pressing apparatus 456. As shown in FIG. 44, the heating and pressing apparatus 456 includes a lower module 460 that is positioned closer to the floor and an upper module 462 that is positioned closer to the ceiling.

The lower module 460 includes a raising and lowering section 466, a lower pressure control module 468, a lower heating module 470, and a lower top plate 472.

The raising and lowering section 466 raises and lowers the lower pressure control module 468, the lower heating module 470 and the lower top plate 472, together with the multilayer substrate 492. The raising and lowering section 466 raises the multilayered substrate 492 held by the lower substrate holder 502 and the upper substrate holder 504, even after the upper substrate holder 504 comes into contact with the lower surface of the upper module 462. In this way, the raising and lowering section 466 pressures the multilayered substrate 492.

The lower pressure control module 468 is positioned on the upper surface of the raising and lowering section 466. The lower pressure control module 468 has a hollow pressing section 469. The hollow pressing section 469 is formed by a rubber sheet or the like and is a bag-like pressure controller. The inside of the hollow pressing section 469 is filled with a fluid supplied from outside. The shape of the hollow pressing section 469 is changed by controlling the amount of the fluid supplied. In this way, the lower pressure control module 468 controls, within the horizontal plane, the pressure applied by the raising and lowering section 466 to the multilayered substrate 492. For example, the hollow pressing section 469 controls the pressure within the horizontal plane by controlling the upper surface to be flat, deforming the central portion of the upper surface in a convex manner, or deforming the edge portion of the upper surface in a convex manner. The raising and lowering section 466 and the lower pressure control module 468 are an example of a pressing section.

The lower heating module 470 is positioned above the lower pressure control module 468. The lower heating module 470 includes a plurality of electrical heaters. The electrical heaters are independently controllable in terms of temperature.

The lower top plate 472 is positioned on the upper surface of the lower heating module 470. The lower top plate 472 has a shape like a disk having a larger diameter than the lower substrate holder 502 and the upper substrate holder 504. On the upper surface of the lower top plate 472, the multilayered substrate 492 is placed that is held between the lower substrate holder 502 and the upper substrate holder 504.

The upper module 462 includes an upper heating module 480 including therein a plurality of electrical heaters and an upper top plate 482. The upper heating module 480 has substantially the same configuration as the lower heating module 470 except for that the vertical order is reversed, and the upper top plate 482 has substantially the same configuration as the lower top plate 472.

Figure 45:
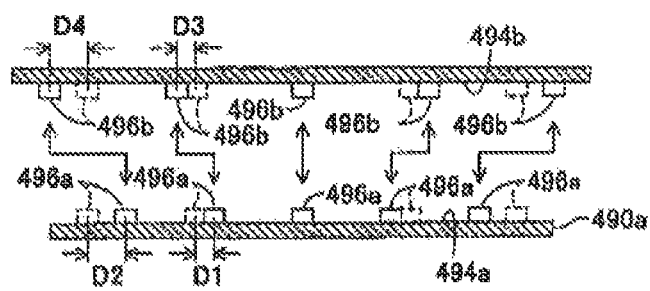
FIG. 45 illustrates misalignment between electrode pads 496a and 496b of substrates 490a and 490b.
Figure 46:
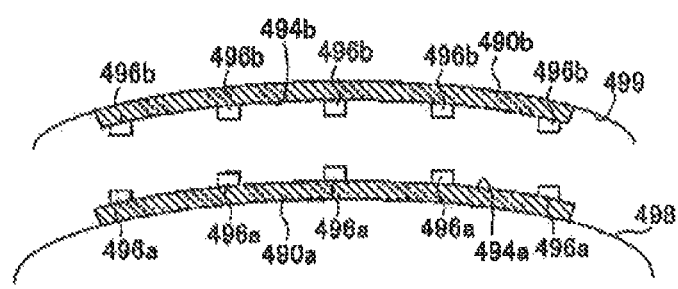
FIG. 46 illustrates how to correct the misalignment between the electrode pads 496a and 496b of the substrates 490a and 490b.
Figure 47:
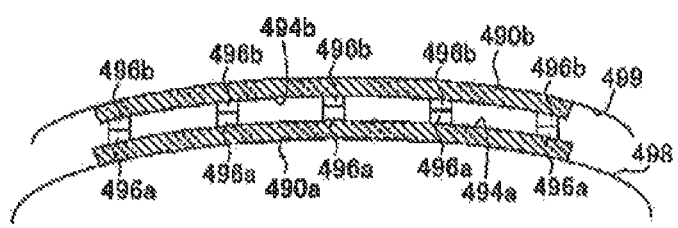
FIG. 47 illustrates how to bond together the position-corrected electrode pads 496a and 496b of the substrates 490a and 490b.

FIG. 45 illustrates misalignment between electrode pads 496a on a substrate 490a and electrode pads 496b on a substrate 490b. FIG. 46 illustrates how to correct the misalignment between the electrode pads 496a on the substrate 490a and the electrode pads 496b on the substrate 490b. FIG. 47 illustrates how to bond the electrode pads 496a on the substrate 490a to the electrode pads 496b on the substrate 490b after the correction. In FIGS. 45 to 47, the lower substrate is designated by a reference numeral 490a, and the upper substrate is designated by a reference numeral 490b.

As shown in FIG. 45, the electrode pads 496a are formed on a to-be-bonded surface 494a of the substrate 490a, and the electrode pads 496b are formed on a to-be-bonded surface 494b of the substrate 490b. The positions of the electrode pads 496a and 496b are defined in such a manner that each electrode pad 496a is connected to any one of the electrode pads 496b when the substrate 490a is bonded to the substrate 490b. Here, the defined positions of the electrode pads 496a and 496b are represented by the dotted lines in FIG. 45. However, if the substrate 490a shrinks, the positions of the electrode pads 496a move towards the center of the substrate 490a as indicated by the solid lines in FIG. 45. In other words, the electrode pads 496a are off the defined positions by a distance D1 or D2, for example. Conversely, if the substrate 490b expands, the positions of the electrode pads 496b move away from the center of the center of the substrate 490b as indicated by the solid lines in FIG. 45. In other words, the electrode pads 496b are off the defined positions by a distance D3 or D4, for example. If the shrunk substrate 490a and the expanded substrate 490b are bonded to each other while being flat, the electrode pads 496a are not connected to the electrode pads 496b or only partially connected to the electrode pads 496b. This creates poor connection and other problems.

In the present embodiment, the shrunk substrate 490a is pressed by a centrally convex surface 498 whose central portion is convex to be deformed in the direction intersecting with the surface of the substrate 490a, and the expanded substrate 490b is pressed by a centrally concave surface 499 whose central portion is concave to be deformed in the direction intersecting with the surface of the substrate 490b, as shown in FIG. 46.

The to-be-bonded surface 494a of the substrate 490a is bent by the centrally convex surface 498 and becomes convex upwards. Therefore, the electrode pads 496a formed on the to-be-bonded surface 494a of the substrate 490a move away from the center of the substrate 490a in the horizontal direction. As a result, the electrode pads 496a approach the defined positions when seen in plane. On the other hand, the centrally concave surface 499 is concave upwards, and the to-be-bonded surface 494b of the substrate 490b also becomes concave upwards. Thus, the electrode pads 496b formed on the to-be-bonded surface 494h of the substrate 490b move closer to the center of the substrate 490b in the horizontal direction. In this way, the electrode pads 496b approach the defined positions when seen in plane.

In the above-described manner, the out-of-position electrode pads 496a and 496b move closer to each other in the horizontal direction and are thus corrected. Here, the differences produced between the defined positions and the actual positions for the electrode pads 496a are preferably of the same sizes as and observed in the opposite direction to the difference produced between the defined positions and the actual positions for the electrode pads 496b, which are to be connected to the electrode pads 496a. However, the differences produced between the defined positions and the actual positions are allowed to contain an error similar to the size of the contact surface of the electrode pads 496a and 496b.

If the substrate 490a is bonded to the substrate 490b after the above procedure, the electrode pads 496a are substantially entirely connected to the electrode pads 496b as shown in FIG. 47. Here, the expansion and shrinkage are merely examples of the deformation, and the present embodiment can similarly address the differences between the defined positions and the actual positions caused by other factors.

Figure 48:
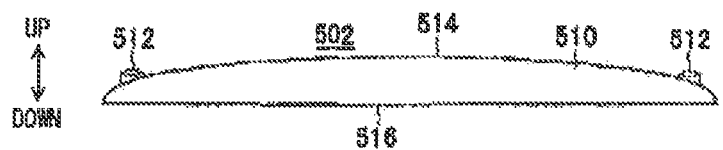
FIG. 48 is a vertical cross-sectional view of a lower substrate holder 502.

FIG. 48 is a vertical cross-sectional view of the lower substrate holder 502. As shown in FIG. 48, the lower substrate holder 502 includes a lower holder body 510 and six attracting elements 512.

The lower holder body 510 is made of a highly rigid material such as ceramics, metals or the like. The lower holder body 510 has a circular shape when seen in plane. The upper surface of the lower holder body 510 serves as a lower holding surface 514 designed to hold the lower substrate 490. The lower holding surface 514 is curved in such a manner that the central portion is convex upwards. In this way, the lower holding surface 514 serves as the above-described centrally convex surface 498, and the substrate 490, which is held by and pressed against the lower holding surface 514, is deformed and curved so that the central portion becomes convex upwards. Here, the curved lower holding surface 514 is a partial spherical or ellipsoidal surface, for example. The lower holding surface 514 is larger than the substrate 490 when seen in plane.

The lower surface of the lower holder body 510 is a flat lower to-be-pressed surface 516. The lower to-be-pressed surface 516 is in plane contact with the upper surface of the movable stage 438 and the upper surface of the lower top plate 472 to horizontally support the lower substrate holder 502. A plurality of electrode plates are embedded in the vicinity of the lower holding surface 514. The electrode plates are designed to hold the substrate 490 by electrostatic attraction. The electrode plates are supplied with power through power supply terminals embedded in the lower to-be-pressed surface 516.

The attracting elements 512 include electric magnets. The electric magnets receive power through the power supply terminals embedded in the lower to-be-pressed surface 516. The six attracting elements 512 are divided into sets of two, which are arranged at intervals of 520° with respect to the center of the lower holder body 510. While the substrate holder 502 is holding the substrate 490, the six attracting elements 512 are positioned outside the substrate 490. Here, the number of the attracting elements 512 is not limited to 6.

Figure 49:
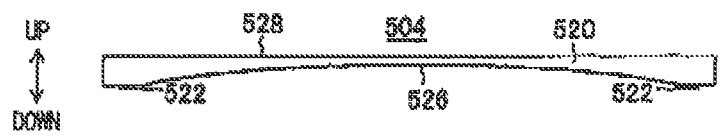
FIG. 49 is a vertical cross-sectional view of an upper substrate holder 504.

FIG. 49 is a vertical cross-sectional view of the upper substrate holder 504. As shown in FIG. 49, the upper substrate holder 504 includes an upper holder body 520 and six to-be-attracted elements 522.

The upper holder body 520 is made of a highly rigid material such as ceramics, metals or the like. The upper holder body 520 has a disk-like shape. The central portion of the lower surface of the upper holder body 520 serves as an upper holding surface 526 that is designed to hold the upper substrate 490. The upper holding surface 526 is larger than the substrate 490 when seen in plane. The central portion of the upper holding surface 526 is curved and concave upwards. Thus, the upper holding surface 526 serves as the above-described centrally concave surface 499, and the substrate 490, which is held by and pressed against the upper holding surface 526, is deformed and curved so that the central portion becomes convex upwards. Here, the curved upper holding surface 526 is a partial spherical or ellipsoidal surface, for example. The upper holding surface 526 is substantially parallel to the lower holding surface 514. In this way, the upper holding surface 526 is complementary to the lower holding surface 514. The peripheral portion of the upper holding surface 526 is flat.

The upper surface of the upper holder body 520 is an upper to-be-pressed surface 528. The upper to-be-pressed surface 528 is flat. The upper to-be-pressed surface 528 is in plane contact with the lower surface of the stationary stage 436 and the lower surface of the upper top plate 482, to horizontally support the upper substrate holder 504. Here, in the substrate holder rack 422 and on the movable stage 438, the upper substrate holder 504 is placed in such a manner that the upper to-be-pressed surface 528 faces down. In the vicinity of the upper holding surface 526, a plurality of electrode plates are embedded to hold the substrate 490 by electrostatic attraction.

The to-be-attracted elements 522 include permanent magnets. The to-be-attracted elements 522 are arranged on the lower surface of the upper holder body 520 outside the upper holding surface 526. The six to-be-attracted elements 522 are positioned so as to oppose the attracting elements 512 of the lower substrate holder 502. While the to-be-attracted elements 522 are attracted by the attracting elements 512, the lower substrate holder 502 and the upper substrate holder 504 are secured to each other.

Figure 50:
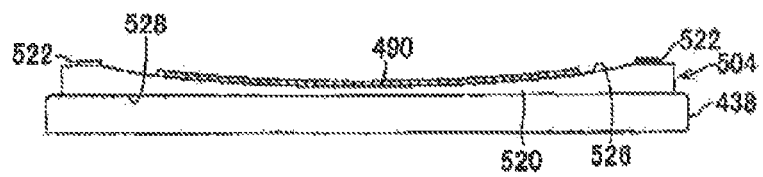
FIG. 50 illustrates the manufacturing process of a multilayered substrate 492 performed by the substrate bonding apparatus 410.

FIGS. 50 to 55 illustrate how to manufacture the multi-layered substrate 492 using the substrate bonding apparatus 410. In the bonding step, to begin with, the robot arm 424 transports the substrate 490 from any one of the substrate cassettes 420 to the pre-aligner 426. After this as shown in FIG. 50, the robot arm 430 transports the upper substrate holder 504 from the substrate holder rack 422 to the movable stage 438. The movable stage 438 attracts the upper substrate holder 504 using vacuum. The robot arm 430 transports the substrate 490 that has been adjusted in position by the pre-aligner 426, to the upper holding surface 526 of the upper substrate holder 504 that is placed on the movable stage 438, and places the substrate 490 on the upper holding surface 526. Here, this substrate 490 is the upper substrate. The upper substrate holder 504 electrostatically attracts the placed substrate 490. Here, note that the upper holding surface 526, which is holding the upper substrate 490, has a central portion that is curved in a concave manner. Accordingly, the upper holding surface 526 bends and deforms the upper substrate 490 in such a manner that the central portion of the upper substrate 490 becomes curved and convex downwards following the concave curved surface of the upper holding surface 526. As a result, the to-be-bonded surface or the upper surface of the upper substrate 490 is deformed so that the central portion becomes concave, as shown in FIG. 50.

Figure 51:
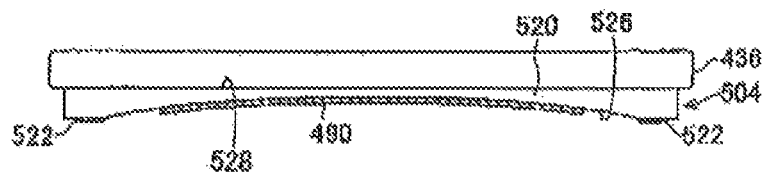
FIG. 51 illustrates the manufacturing process of the multilayered substrate 492 performed by the substrate bonding apparatus 410.

After this, the robot arm 430 turns over the upper substrate holder 504 holding the substrate 490 and transports the turned-over upper substrate holder 504 from the movable stage 438 to the stationary stage 436. The stationary stage 436 receives the upper substrate holder 504 as well as the substrate 490 from the robot arm 430 and then holds the upper substrate holder 504 using vacuum attraction, as shown in FIG. 51. In this manner, the upper substrate 490 is curved in an upward convex manner.

Figure 52:
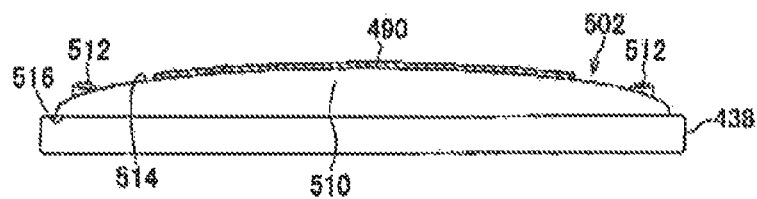
FIG. 52 illustrates the manufacturing process of the multilayered substrate 492 performed by the substrate bonding apparatus 410.

After this, a similar operation is performed. Specifically speaking, the robot arm 430 transports the lower substrate holder 502 to the movable stage 438, and the robot arm 424 then transports the substrate 490 to the lower substrate holder 502 on the movable stage 438. Here, the lower substrate 490 transported to the lower substrate holder 502 is selected taking into consideration the deformation of the upper substrate 490 held by the upper substrate holder 504. For example, the lower substrate 490 is selected such that the differences produced between the defined positions and the actual positions for the electrode pads on the lower substrate 490 are of the same sizes as and observed in the opposite direction to the difference produced between the defined positions and the actual positions for the electrode pads on the upper substrate 490. As shown in FIG. 52, the movable stage 438 holds the substrate 490 and the lower substrate holder 502 with the substrate 490 facing upwards. Here, the lower holding surface 514 that is holding the lower substrate 490 is curved in an upward convex manner. Accordingly, the lower holding surface 514 bends and deforms the lower substrate 490 so as to follow the convex curved surface, so that the central portion of the lower substrate 490 becomes convex upwards and the lower substrate 490 is curved in a complementary and parallel manner to the upper substrate 490. In this manner, the to-be-bonded surface or the upper surface of the lower substrate 490 is deformed in such a manner that the central portion becomes convex. After this, the shutters 440 and 442 are closed, and the movable stage 438 then moves to be positioned under the stationary stage 436 holding the substrate 490 and the upper substrate holder 504, while holding the substrate 490 and the lower substrate holder 502. Following this the substrate 490 on the movable stage 438 is aligned to the substrate 490 on the stationary stage 436.

Figure 53:
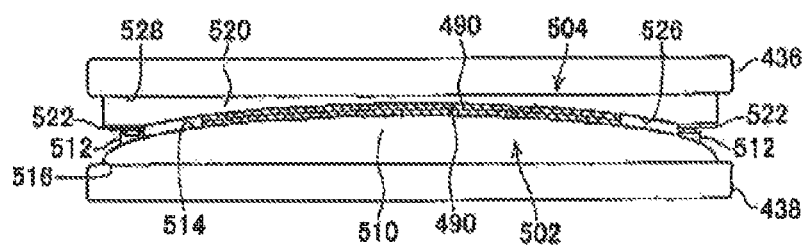
FIG. 53 illustrates the manufacturing process of the multilayered substrate 492 performed by the substrate bonding apparatus 410.

Subsequently, the movable stage 438 moves upwards as shown in FIG. 53. Thus, the attracting elements 512 of the lower substrate holder 502 attract the to-be-attracted elements 522 of the upper substrate holder 504. After the vacuum attraction of the upper substrate holder 504 by the stationary stage 436 is deactivated, the movable stage 438 moves towards the robot arm 430 while attracting the lower substrate holder 502 using vacuum.

After this, the shutter 450 is opened, so that the air lock chamber 448 is in communication with the ordinary-temperature portion 414. Note that the shutter 452 is closed. While this state is maintained, the robot arm 430 transports, to the air lock chamber 448, the deformed substrates 490 stacked on one another and held between the lower substrate holder 502 and the upper substrate holder 504 on the movable stage 438. Subsequently, the shutter 450 is closed and, at the same time, the shutter 452 is opened. Thus, the air lock chamber 448 is blocked from the ordinary-temperature portion 414 and in communication with the high-temperature portion 416. While this state is maintained, the robot arm 454 transports the stacked substrates 490 together with the lower substrate holder 502 and the upper substrate holder 504, from the air lock chamber 448 to the heating and pressing apparatus 456.

Figure 54:
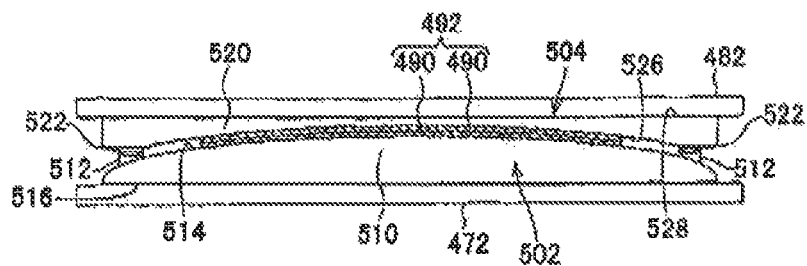
FIG. 54 illustrates the manufacturing process of the multilayered substrate 492 performed by the substrate bonding apparatus 410.

In the heating and pressing apparatus 456, the raising and lowering section 466 raises the stacked substrates 490 held between the lower substrate holder 502 and the upper substrate holder 504. In this manner, the upper to-be-pressed surface 528 of the upper substrate holder 504 comes into plane contact with the lower surface of the upper top plate 482. While this state is maintained, the lower heating module 470 and the upper heating module 480 heat the stacked substrates 490 to a joining temperature and maintain the joining temperature. The raising and lowering section 466 further raises the lower top plate 472, so that the pair of substrates 490 to be formed into the multilayered substrate 492 is pressed while being bent. Here, since the lower holding surface 514 and the upper holding surface 526 bend the substrates 490, the substrates 490 are bonded to each other after the electrode pads 496*a* and 496*b* are corrected in terms of position as shown in FIGS. 46 and 47. Furthermore, since the deformed substrates 490 are curved in parallel to each other, the substrates 490 are in close contact with and bonded to each other to be formed into the multilayered substrate 492 as shown in FIG. 54.

After this, the shutter 452 is opened and, at the same time, the shutter 450 is closed. Thus, the air lock chamber 448 is blocked from the ordinary-temperature portion 414 and in communication with the high-temperature portion 416. After this, the robot arm 454 transports, to the air lock chamber 448, the multilayered substrate 492 obtained as a result of the bonding procedure together with the lower substrate holder 502 and the upper substrate holder 504.

Figure 55:
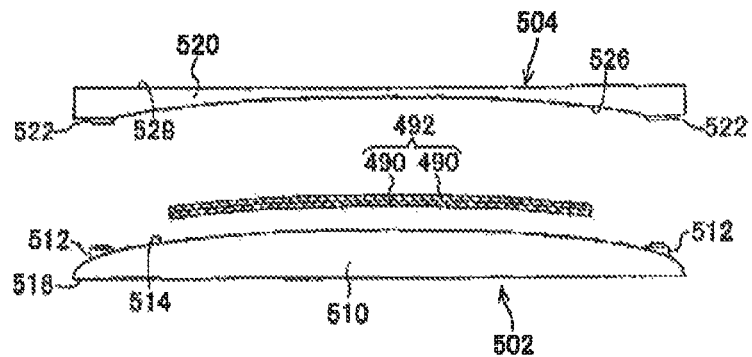
FIG. 55 illustrates the manufacturing process of the multilayered substrate 492 performed by the substrate bonding apparatus 410.

Subsequently, the shutter 452 is closed and, at the same time, the shutter 450 is opened. Thus, the air lock chamber 448 is blocked from the high-temperature portion 416 and in communication with the ordinary-temperature portion 414. While this state is maintained, the robot arm 430 transports the multilayered substrate 492 together with the lower substrate holder 502 and the upper substrate holder 504, from the air lock chamber 448 to the movable stage 438. As shown in FIG. 55, the multilayered substrate 492 is then removed from the lower substrate holder 502 and the upper substrate holder 504, on the movable stage 438. After this, the robot arm 424 transports the multilayered substrate 492 to one of the substrate cassettes 420. In this manner, the substrate bonding apparatus 410 completes the step of bonding the substrates 490 into the multilayered substrate 492.

As described above, the substrate bonding method relating to the present embodiment bonds the substrates 490 to each other while they are bent complementarily to each other into the multilayered substrate 492. The substrates 490 may expand or shrink and the electrode pads 496*a* and 496*b* may be differently positioned than being defined. The present embodiment, however, ensures that the electrode pads 496*a* and 496*b* can be connected.

According to the present embodiment, the substrates 490 are bonded to each other after deformed to be curved in parallel to each other. This can improve the adhesiveness between the bonded substrates 490.

According to the present embodiment, the lower holding surface 514 of the lower substrate holder 502 and the upper holding surface 526 of the upper substrate holder 504 bend and deform the substrates 490. Therefore, the deformed shapes of the substrates 490 can be easily predicted, and the differences produced between the defined positions and the actual positions can be corrected with improved accuracy.

The following describes other embodiments that are partly different from the above-described embodiment.

Figure 56:
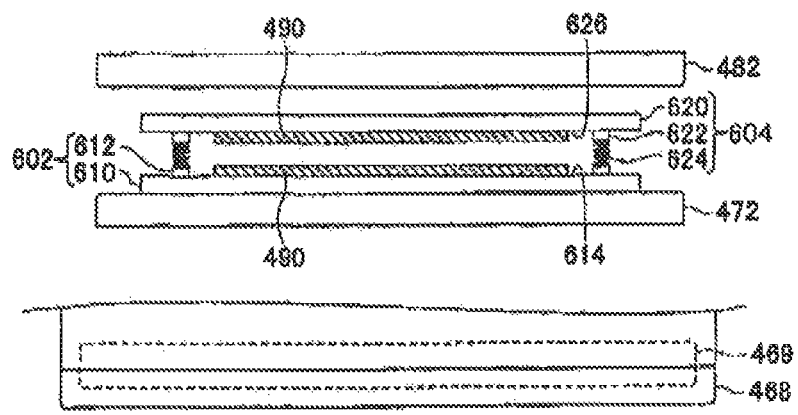
FIG. 56 shows the pre-deformed states of substrates 490.
Figure 57:
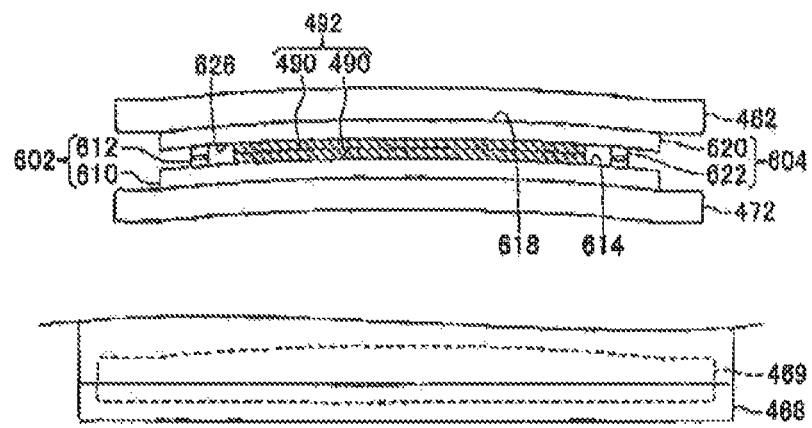
FIG. 57 illustrates the substrates 490 that have been bent by a lower pressure control module 468.

The following describes a substrate bonding method according to which the lower pressure control module 468 is used to bend the substrates 490, FIG. 56 illustrates the substrates 490 before their deformation. FIG. 57 illustrates the substrates 490 that have been bent by the lower pressure control module 468.

In the present embodiment, a lower substrate holder 602 and an upper substrate holder 604 are flat and have a disk-like shape. In addition, a lower holding surface 614 of a lower holder body 610 of the lower substrate holder 602 and an upper holding surface 626 of an upper holder body 620 of the upper substrate holder 604 are both flat. Accordingly, the substrates 490 are flat while being transported to the heating and pressing apparatus 456.

The upper substrate holder 604 includes elastic members 624. The elastic members 624 include metal springs. The elastic members 624 are positioned on the lower surface of to-be-attracted elements 622. With such a configuration, while the to-be-attracted elements 622 are attracted to attracting elements 612, the elastic members 624 are positioned between the to-be-attracted elements 622 and the attracting elements 612. Here, the elastic force of the elastic members 624 is higher than the attracting force acting between the attracting elements 612 and the to-be-attracted elements 622.

Thus, as long as no other external forces are acting, the elastic members 624 separate the substrate 490 held by the lower substrate holder 602 from the substrate 490 held by the upper substrate holder 604 while the to-be-attracted elements 622 are attracted to the attracting elements 612. While being separated from each other, the substrates 490 are then transported to the lower top plate 472 of the heating and pressing apparatus 456 as shown in FIG. 56.

Subsequently, the raising and lowering section 466 raises the lower top plate 472 together with the substrates 490, so that a to-be-pressed surface 618 of the upper substrate holder 604 comes into contact with the lower surface of the upper top plate 482 as shown in FIG. 57. While this state is maintained, a fluid is supplied to the hollow pressing section 469 of the lower pressure control module 468. As a result, the upper surface of the hollow pressing section 469 is deformed and curved to be convex upwards. As the raising and lowing section 466 further raises the lower top plate 472, the elastic members 624 shrink and the substrates 490 consequently come into contact with each other. Furthermore, the lower top plate 472 is deformed and curved to be convex upwards, following the upper surface of the hollow pressing section 469. Furthermore, the lower substrate holder 602, the substrates 490, the upper substrate holder 604 and the upper top plate 482 are bent and deformed to be curved in an upward convex manner, following the lower top plate 472. Here, the upper surface of the lower top plate 472, which applies a pressure, serves as the centrally convex surface 498, and the lower surface of the upper top plate 482, which applies a pressure, serves as the centrally concave surface 499. Thus, the substrates 490 are pressed while the upper surface of the lower top plate 472 and the lower surface of the upper top plate 482 are deformed complementarily to each other.

As a result, the substrates 490 are deformed complementarily to each other, which corrects the differences produced between the defined positions and the actual positions for the electrode pads of the substrates 490 in preparation for the bonding procedure of the substrates 490. In this way, the multilayered substrate 492 is completed.

Figure 58:
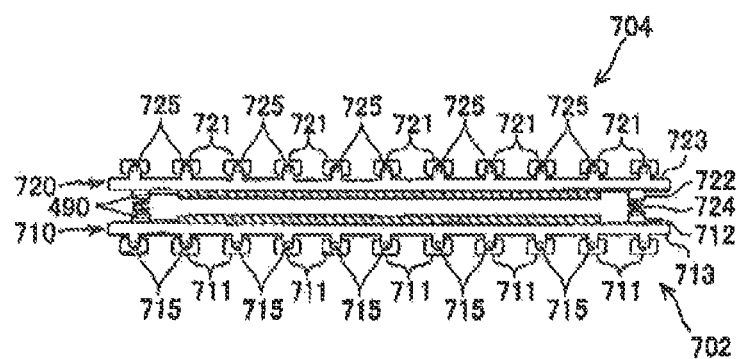
FIG. 58 shows a lower substrate holder 702 and an upper substrate holder 704 respectively holding the substrates 490.
Figure 59:
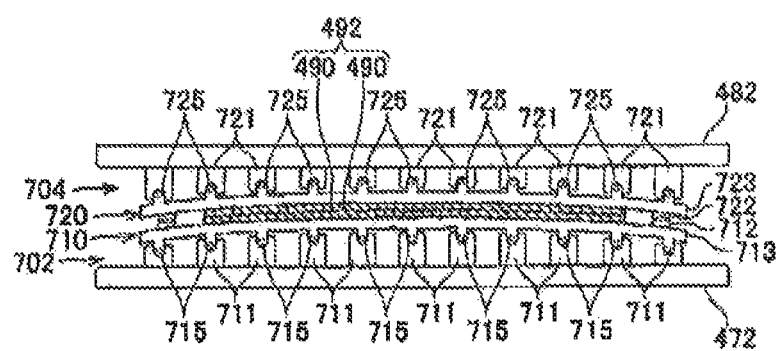
FIG. 59 illustrates the substrates 490 that have been bent by the lower substrate holder 702 and the upper substrate holder 704.

FIG. 58 illustrates a lower substrate holder 702 and an upper substrate holder 704 holding the substrates 490. FIG. 59 illustrates the substrates 490 that have been bent by the lower substrate holder 702 and the upper substrate holder 704. The following describes a substrate bonding method according to which the lower substrate holder 702 and the upper substrate holder 704 control pressures to apply in various regions within the horizontal plane.

In the present embodiment, the lower substrate holder 702 includes a lower holder body 710, a plurality of lower partial pressing members 711, and an attracting element 712 including an electric magnet, as shown in FIG. 58.

The lower holder body 710 has a substantially flat lower disk-like portion 713 and a plurality of lower legs 715. The lower disk-like portion 713 includes an electrode plate designed to electrostatically attract the substrate 490. The lower legs 715 are arranged on the lower surface of the lower disk-like portion 713. The lower legs 715 are arranged in such a manner that the number of lower legs 715 per unit area is substantially the same within the horizontal plane. The lower ends of the lower legs 715 are rotatably coupled to the lower partial pressing members 711.

The lower partial pressing members 711 are provided on the lower ends of the lower legs 715. Accordingly, the lower partial pressing members 711 are arranged within the horizontal plane in such a manner that the number of the lower partial pressing members 711 per unit area is substantially the same. The lower partial pressing members 711 include piezoelectric members. The lower partial pressing members 711 are applied with different voltages front the lower top plate 472. In this manner, each lower partial pressing member 711 is deformed into a different shape and independently applies a different pressure to the substrate 490. Since each lower partial pressing member 711 is independently deformed the lower disk-like portion 713 of the lower holder body 710 coupled thereto is deformed from the flat shape to a different shape.

The upper substrate holder 704 includes an upper holder body 720, a plurality of upper partial pressing members 721, a to-be-attracted element 722 including a permanent magnet, and an elastic member 724 including a spring. The upper substrate holder 704 has substantially the same configuration as the lower substrate holder 702 and the following only mentions its differences from, the lower substrate holder 702. The upper holder body 720 includes a substantially flat upper disk-like portion 723 and a plurality of upper legs 725. The upper legs 725 are provided on the upper surface of the upper disk-like portion 723. The upper partial pressing members 721 are coupled to the upper ends of the upper legs 725. The upper partial pressing members 721 are applied with different voltages to independently apply different pressures to the substrate 490.

The lower substrate holder 702 and the upper substrate holder 704 attract the substrates 490 using the respective electrode plates. While this state is maintained, the substrates 490 are aligned, after which the attracting element 712 attracts the to-be-attracted element 722. In this way, the lower substrate holder 702 and the upper substrate holder 704 respectively hold the substrates 490 with a gap being formed between the substrates 490 as shown in FIG. 58. While this state is maintained, the substrates 490 are transported to the lower top plate 472 of the heating and pressing apparatus 456.

Subsequently, the raising and lowering section 466 raises the substrates 490 together with the lower substrate holder 702 and the upper substrate holder 704. As a result, the upper partial pressing members 721 of the upper substrate holder 704 come into contact with the upper top plate 482. After this, the raising and lowering section 466 further raises the substrates 490, which brings the substrates 490 into contact with each other. While this state is maintained, the lower partial pressing members 711 and the upper partial pressing members 721 are applied with voltages. Consequently, the upper surface of the lower disk-like portion 713 of the lower holder body 710 is deformed and curved in an upward convex manner, and the lower surface of the upper disk-like portion 723 of the upper holder body 720 is deformed and curved in an upward concave manner, complementarily to the deformed upper surface of the lower disk-like portion 713. The upper surface of the lower disk-like portion 713 serves as the centrally convex surface 498, and the lower surface of the upper disk-like portion 723 serves as the centrally concave surface 499. Consequently, the lower partial pressing members 711 and the upper partial pressing members 721 pressure the lower substrate 290 and the upper substrate 490 through the lower disk-like portion 713 and the upper disk-like portion 723, so that the lower and upper substrates 490 are deformed and curved in an upward convex manner. After this, the substrates 490 are heated and pressed to be bonded to each other and thus formed into the multilayered substrate 492.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A substrate bonding apparatus comprising:
    a controller configured to calculate an amount of misalignment between two substrates that are to be stacked on each other;
    a deformer operable to bend at least a first substrate of the two substrates in order to deform the first substrate in accordance with the calculated amount of misalignment between the two substrates; and
    a bonder operable to bond the first substrate in which the misalignment is corrected based on deformation by the deformer to a second substrate of the two substrates.

2. The substrate bonding apparatus as set forth in claim 1, further comprising
    a holder that holds the first substrate, wherein
    while the first substrate is not held by the holder, the deformer deforms the holder from a first state to a second state that is more deformed than the first state, and
    while the first substrate is held by the holder, the deformer reduces the amount of the deformation of the holder to less than the amount of the deformation of the second state to deform the first substrate.

3. The substrate bonding apparatus as set forth in claim 2, wherein
    the holder is returned to the first state by the deformer after holding the first substrate.

4. The substrate bonding apparatus as set forth in claim 2, wherein
    the first state is a state in which a holding surface of the holder is flat.

5. The substrate bonding apparatus as set forth in claim 2, wherein
    the holder includes a holding surface having a curved section that is curved with a predetermined curvature, and
    the deformer deforms the first substrate in an amount of the deformation in accordance with an amount of the correction of the misalignment by holding the first substrate on the holding surface.

6. The substrate bonding apparatus as set forth in claim 5, wherein
    the deformer deforms the first substrate by deforming the holder in such a manner that the curvature of the curved section varies while the first substrate is held on the holding surface.

7. The substrate bonding apparatus as set forth in claim 2, wherein
    the holder is divided into a plurality of regions and the deformer independently deforms the regions from each other.

8. The substrate bonding apparatus as set forth in claim 2, wherein
    the bending rigidity of the holder is higher than the bending rigidity of the first substrate.

9. The substrate bonding apparatus as set forth in claim 2, wherein
    the holder is a substrate holder that moves together with the first substrate.

10. The substrate bonding apparatus as set forth in claim 9, wherein
    the substrate holder holds the first substrate through electrostatic attraction.

11. The substrate bonding apparatus as set forth in claim 9, comprising
    a support that supports the substrate holder, wherein
    the support is deformed by the deformer and the substrate holder is deformed by the deformation of the support.

12. The substrate bonding apparatus as set forth in claim 11, wherein
    the bending rigidity of the support is higher than the sum of the bending rigidity of the first substrate and the bending rigidity of the substrate holder.

13. The substrate bonding apparatus as set forth in claim 11, wherein
    the deformer includes a plurality of actuators that are driven to apply a deforming force to the support and a plurality of elastic members that couple the respective ones of the actuators to the support, and
    each of the elastic members is elastically deformed in a direction orthogonal to a driven direction of the actuators while passing a driving force in the driven direction.

14. The substrate bonding apparatus as set forth in claim 11, wherein
    the deformer includes a plurality of actuators that are driven to apply a deforming force to the support and a plurality of couplers that couple the respective ones of the actuators to the support, and each of the couplers is slidably coupled to at least one of the support and a corresponding one of the actuators, in a direction orthogonal to a driven direction of the actuators.

15. The substrate bonding apparatus as set forth in claim 2, wherein
the deformer includes a plurality of actuators that are driven to apply a deforming force to the holder.

16. The substrate bonding apparatus as set forth in claim 2, further comprising
an aligner that aligns the two substrates, wherein
when misalignment equal to or more than a threshold value remains between the two substrates that have been aligned by the aligner, the deformer deforms the holder.

17. The substrate bonding apparatus as set forth in claim 2, further comprising
a transporter that transports the holder holding the first substrate deformed by the deformer to the bonder while the first substrate remains deformed.

18. The substrate bonding apparatus as set forth in claim 1, wherein
the amount of the deformation achieved by the deformer is associated in advance with the amount of the correction of the misalignment, and the deformer achieves the deformation the amount of which is determined in accordance with the amount of the correction of the misalignment.

19. The substrate bonding apparatus as set forth in claim 1, wherein
the deformer deforms the first substrate by bending the first substrate and deforms the second substrate by bending the second substrate in a complementary manner to the first substrate, and
the bonder bonds the first substrate to the second substrate while the first and second substrates both remain bent.

20. The substrate bonding apparatus as set forth in claim 19, wherein
the deformer deforms in a concave manner a central portion of a to-be-bonded surface of the first substrate and deforms in a convex manner a central portion of a to-be-bonded surface of the second substrate.

21. The substrate bonding apparatus according to claim 1, wherein the deformer is further operable to bend at least the first substrate of the two substrates in order to change a magnification ratio of the first substrate in accordance with the calculated amount of misalignment between the two substrates.

22. A substrate bonding apparatus comprising:
a controller configured to calculate an amount of misalignment between two substrates that are to be stacked on each other;
a deformer operable to deform at least a first substrate of the two substrates in accordance with the calculated amount of misalignment between the two substrates;
a holder that holds the first substrate in a state where the misalignment is correct through deformation by the deformer;
a transporter that transports the holder holding the first substrate in a state where the misalignment is corrected from a position at which the first substrate is held by the holder; and
a bonder operable to bond the first substrate that has been transported by the transporter to the second substrate.

23. The substrate bonding apparatus according to claim 22, wherein the deformer is further operable to change a magnification ratio of at least the first substrate of the two substrates in accordance with the calculated amount of misalignment between the two substrates.

24. A substrate holding apparatus comprising:
a controller configured to calculate an amount of misalignment between two substrates that are to be stacked on each other;
a holder that holds a first substrate of the two substrates to be bonded to a second substrate of the two substrates; and
a deformer that deforms the first substrate while being held by the holder by bending the first substrate in order to correct the calculated amount of misalignment between the first substrate and the second substrate.

25. The substrate holding apparatus according to claim 24, wherein the deformer deforms the first substrate while being held by the holder by changing a magnification ratio of the first substrate in order to correct the calculated amount of misalignment between the first substrate and the second substrate.

26. A substrate holding apparatus comprising:
a controller configured to calculate an amount of misalignment between two substrates that are to be stacked on each other;
a holder operable to hold a first substrate of the two substrates to be bonded to a second substrate of the two substrates; and
a deformer operable to deform the first substrate by bending the first substrate in order to correct the obtained amount of misalignment between the first substrate and the second substrate.

27. A substrate bonding apparatus comprising:
the substrate holding apparatus as set forth in claim 26; and
a bonder operable to bond the first substrate in which the misalignment is corrected based on deformation by the deformer to the second substrate.

* * * * *